United States Patent [19]

Vinal

[11] Patent Number: 4,654,684
[45] Date of Patent: Mar. 31, 1987

[54] MAGNETICALLY SENSITIVE TRANSISTORS UTILIZING LORENTZ FIELD POTENTIAL MODULTION OF CARRIER INJECTION

[75] Inventor: Albert W. Vinal, Cary, N.C.

[73] Assignee: International Business Machines Corp., Armonic, N.Y.

[21] Appl. No.: 585,012

[22] Filed: Mar. 2, 1984

Related U.S. Application Data

[63] Continuation of Ser. No. 253,128, Apr. 13, 1981, abandoned.

[51] Int. Cl.[4] .................. H01L 27/04; H01L 29/82
[52] U.S. Cl. .................................... 357/27; 357/35; 357/89; 357/36
[58] Field of Search .................. 357/27, 35, 89, 90

[56] References Cited

U.S. PATENT DOCUMENTS

| | | | |
|---|---|---|---|
| 3,585,462 | 6/1971 | Lehovec | 357/27 |
| 3,668,439 | 6/1972 | Fujikawa et al. | 357/27 |
| 3,683,242 | 8/1972 | Hutson | 357/27 |
| 3,692,595 | 9/1972 | Hudson, Jr. | 357/27 |
| 3,714,559 | 1/1973 | Bate | 357/27 |
| 3,829,883 | 8/1974 | Bate | 357/27 |
| 4,056,810 | 11/1977 | Hart et al. | 357/92 |
| 4,276,555 | 6/1981 | Vinal | 357/27 |

FOREIGN PATENT DOCUMENTS

| | | | |
|---|---|---|---|
| EP-6983 | 1/1980 | European Pat. Off. | 357/27 |
| 2000253 | 7/1971 | Fed. Rep. of Germany | 357/27 |

OTHER PUBLICATIONS

Zieren, IEEE IEDM, Dec. 1980, Tech Digest, pp. 669–672.

Primary Examiner—William D. Larkins
Attorney, Agent, or Firm—Edward H. Duffield

[57] ABSTRACT

Magnetically sensitive transistors utilizing a newly discovered transduction mechanism are described. The transduction mechanism is Lorentz field potential modulation of carrier injection at the emitter-base junction. Either avalanching or non-avalanching collectors are utilized in a structure having a single emitter and at least one but preferably two collectors. The emitter-base junction is forward biased to inject carriers and the collector-base junctions are reverse biased to collect carriers. Carrier injection is modulated by a Lorentz field. The Lorentz field is produced across the injecting surface of the emitter by interaction between the moving injected carriers by intersection with a magnetic field according to the Lorentz principle. The Lorentz field biases a portion of the emissive surface to inject more heavily and biases the remaining portion to inject less heavily. The carriers streaming toward the separate collectors are thus more heavily concentrated for one collector than the other. For maximum sensitivity, it is important to configure the positions and dimensions of the emitter and collector or collectors such that the maximum Lorentz potential, and hence the maximum biasing modulation, is applied to the predominant injection area of the emitter. Since the maximum Lorentz potential can be developed across the longest physical dimension of the emitter, the preferred arrangement of emitter and collector is with the collector located to one side or the other (or both sides where two collectors are employed) of an imaginary plane bisecting the maximum Lorentz contour. The Lorentz potential can be developed on one geometrical axis and electrically coupled to a primary injection area elsewhere or on another axis for maximum effect.

1 Claim, 34 Drawing Figures

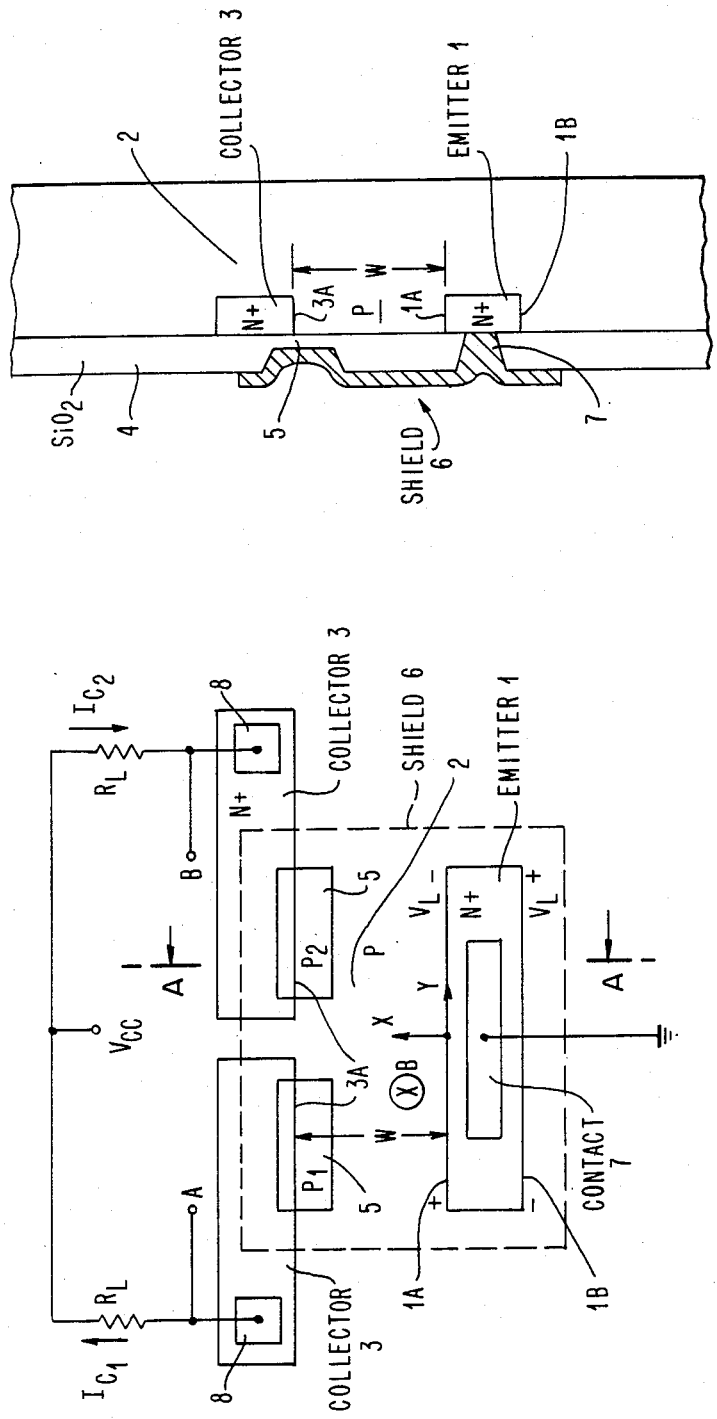

BASIC AVALANCHE
V-I PROPERTY

SIGNAL RESPONSE
SHOWING PHASE
REVERSAL PROPERTY

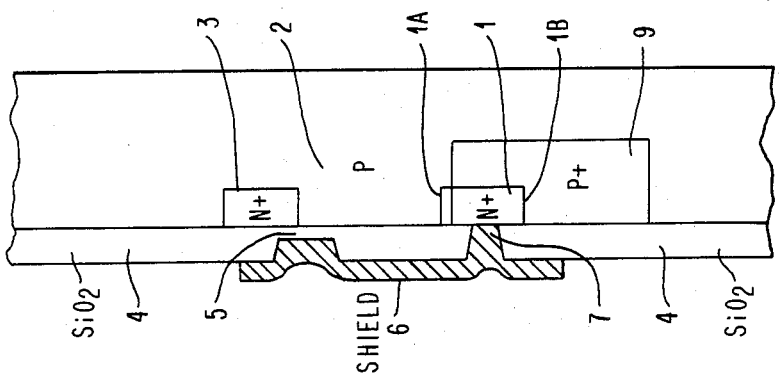
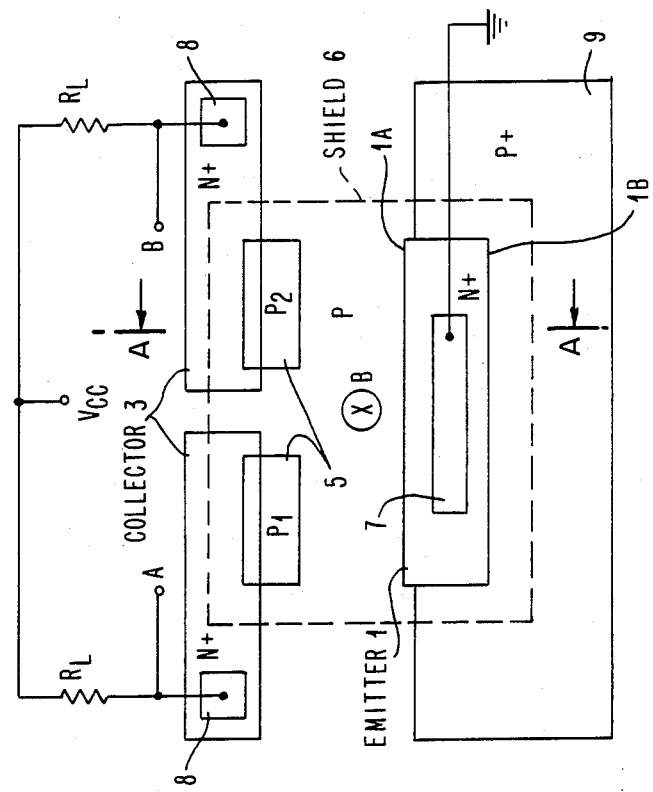
FIG. 7B
FIG. 7A

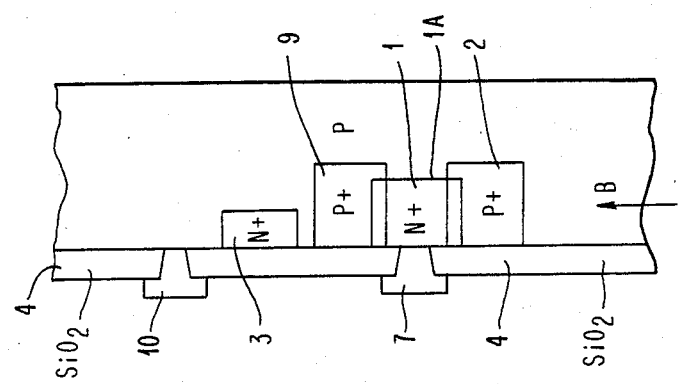
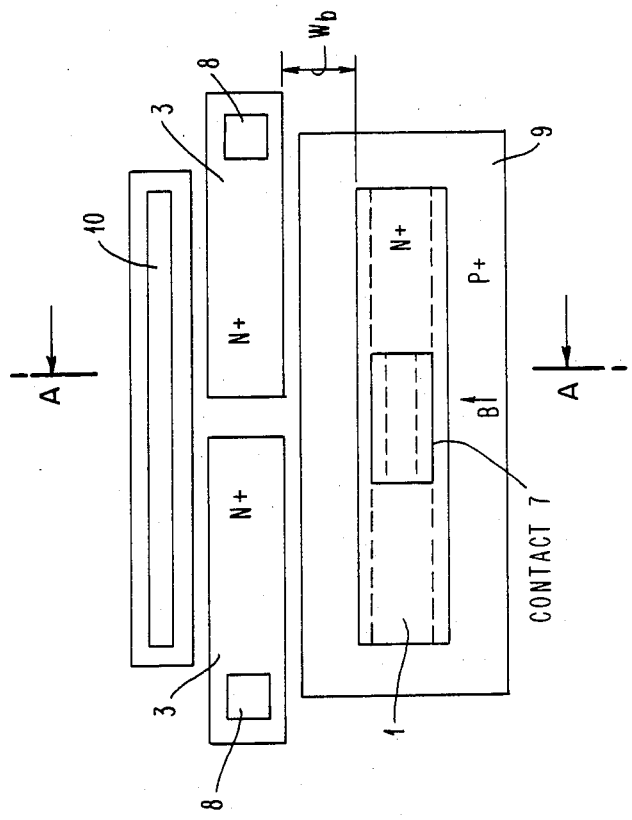

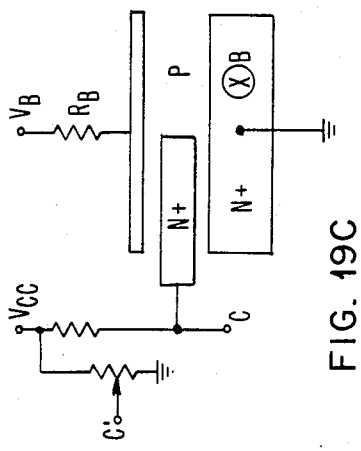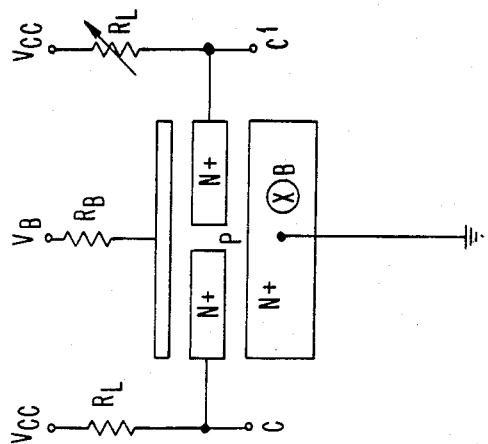
FIG. 19C
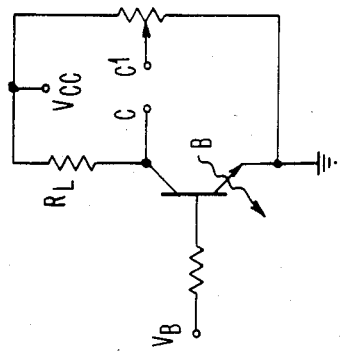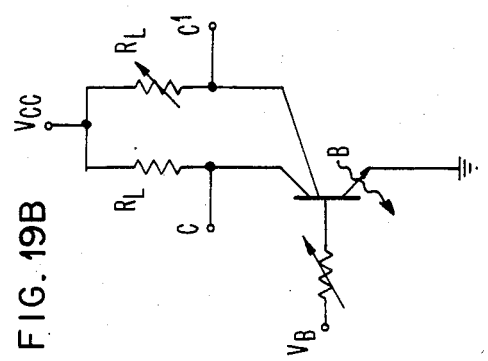
FIG. 19B
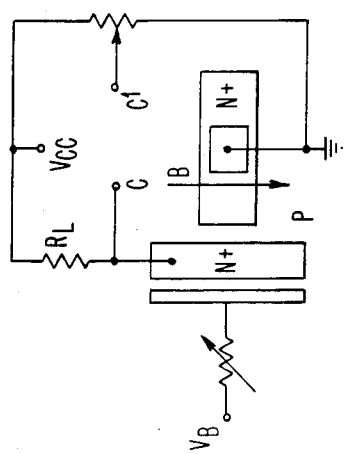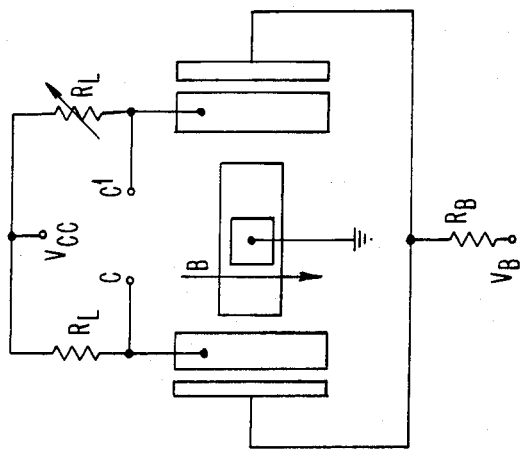
FIG. 19A

MAGNETICALLY SENSITIVE TRANSISTORS UTILIZING LORENTZ FIELD POTENTIAL MODULTION OF CARRIER INJECTION

RELATED APPLICATION

This is a continuation of application Ser. No. 253,128 filed 4-13-81, now abandoned.

This application is related to my co-pending applications Ser. No. 924,489, now U.S. Pat. No. 4,276,555, filed 7-13-78 and is a continuation-in-part of Ser. No. 145,408, now U.S. Pat. No. 4,288,708 filed 5-1-80 and assigned to the common assignee herewith.

BACKGROUND AND FIELD OF THE INVENTION

This invention relates to magnetic sensors in general and in particular to semiconductive transistor configurations which are magnetically sensitive.

PRIOR ART

A variety of magnetically sensitive transistor structures have been previously described in the prior art. For example, the patents of E. C. Hudson, Jr., such as U.S. Pat. Nos. 3,389,230, 3,533,159 or 3,692,595 are known to exist. Also known is a paper by V. Zieren published by the IEEE in IEDM, December, 1980 pp. 669-672. This paper details, in addition to the aforementioned work by E. C. Hudson, Jr. in the cited U. S. patents, a new structure essentially along the lines and of the general organization shown by Hudson. There is an elongated emitter centrally located between two laterally spaced elongated collectors, the collectors being on opposite sides of the emitter and parallel thereto.

A chief difficulty with the known prior art lies in the fact that these devices presumed that the magnetic transduction mechanism was via the deflection of electrons or injected carriers by the magnetic field. Attempts were made in these devices to enhance the deflection from the emitter toward one collector or the other. The general structures used an elongated emitter and two parallelly spaced collectors straddling the emitter on each side thereof. The long axis of the emitter and of the collectors in these devices is parallel with the magnetic field vector to which the device is sensitive. By adopting such a configuration, these devices failed to recognize or utilize the newly discovered transduction mechanism utilized in the present invention.

OBJECTS OF THE INVENTION

In view of the foregoing difficulties with the known prior art, it is an object of the present invention to provide an improved magnetically sensitive transistor in which the collector to emitter orientation is optimized to take advantage of Lorentz field modulation of emitter injection.

A further object of the present invention is to provide an improved magnetically sensitive transistor in which means are included for limiting or controlling the dominant area of carrier injection from the emitter to a specified smaller portion of the total emitter-base junction area.

SUMMARY

As described herein, the foregoing objects of the present invention are met by providing in a magnetic transistor configuration having an emitter, a base and one or two collectors and means for limiting or controlling the dominant area of injection of carriers from the emitter into the base. Preferably, the dominant injection area is approximately confined to a specified portion of the total emitter base junction area. Furthermore, the configuration of the geometry of the collectors relative to the emitter and base is such that the collector lies to one side, or with two collectors, on opposite sides of an imaginary plane bisecting the dominant area of injection on the emitter surface. This results in spacing the collectors equally about the null point in the Lorentz field potential developed across the Lorentz potential development area of injection on the face or faces of the emitter surface. By this technique, the maximum effect of a Lorentz field potential can be developed and applied for modulation of carrier injection from the primary emissive surface. Both lateral and vertical structures are described in both avalanching and non-avalanching modes of operation. The avalanching mode devices employ the impact ionization promoter areas as described in the aforementioned copending applications.

BRIEF DESCRIPTION OF THE DRAWINGS

FIG. 1 illustrates a plan view in schematic form of an embodiment of one type of magnetic transistor constructed according to the present invention and showing its mode of employment for sensing.

FIG. 2 illustrates a longitudinal cross-section taken along the direction indicated in FIG. 1 and cutting through the emitter and collector areas to show the various layers of material in the device.

FIG. 7A illustrates another preferred embodiment of the invention having means in the base for approximately limiting carrier injection at the emitter to primarily the front face of the emitter facing toward the collectors.

FIG. 7B illustrates a horizontal longitudinal cross-section through the device shown in FIG. 7A and cutting through the emitter and collectors.

FIG. 14A illustrates a plan view of a vertically injecting emitter configuration of a preferred, non-avalanching form of the magnetically sensitive transistors of the present invention.

FIG. 14B illustrates a longitudinal cross-section taken along the line indicated through the device in FIG. 14A.

FIG. 15B illustrates a longitudinal cross-section taken along the line indicated through the device in FIG. 15A.

FIG. 19A illustrates a means of electrically connecting the structure of FIGS. 16 and 17.

FIG. 19B illustrates the equivalent circuit representations of a single and dual collector magnetic transistor as shown in FIG. 19A.

FIG. 19C illustrates a means of electrically connecting single and dual collector magnetic transistors which employ lateral injection techniques.

DETAILED SPECIFICATION

Figure 3A:
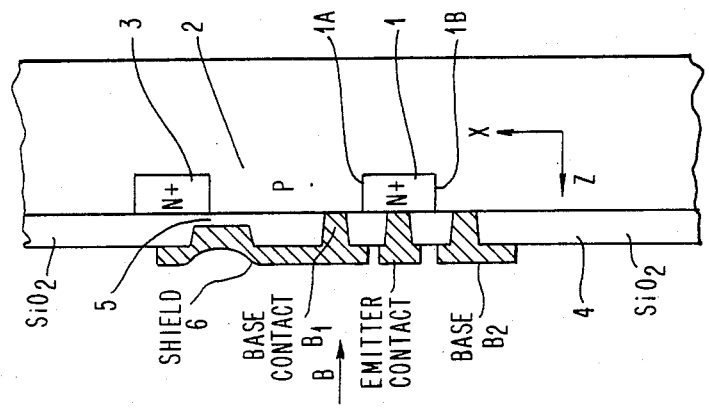
FIG. 3A illustrates a longitudinal cross-section taken through the device in FIG. 3 as indicated.

As noted above, a new primary transduction mechanism has been identified which is responsible for the magnetic sensitivity of a variety of magnetic transistors. This mechanism was discovered while investigating the various configurations and operative parameters involved with my two aforementioned copending applications. The new transduction mechanism is called Lorentz field induced modulation of injection at the emitter, or simply Lorentz modulation of injection. The transduction mechanism is operative both in avalanched collector magnetic sensors and in non-avalanched collector magnetic sensors as described herein. The sensor is constructed according to the teaching of the present invention and exhibits sensitivities close to the theoretical limits which are achievable by solid state devices.

A special investigative structure and a series of critical experiments are described herein which reveal the basic nature of the transduction mechanism. A theoretical analysis is also given that describes the effects of the transduction mechanism in terms of the injection modulation principle propounded.

The basic magnetically sensitive transistor structure will be described first with relationship to an embodiment of a three terminal, open-base, lateral transistor operated in the avalanche mode. This transistor is shown in FIGS. 1 and 2 and comprises two collectors, one base and one emitter together with impact ionization promotor regions or means as described in my previously noted applications. A differential output voltage may be sensed at the equal load resistors R connected to the two separate collector terminals. A response signal may be measured between the collector terminals. The amplitude and polarity of the output signal for a given current level is proportional to the intensity and direction of a magnetic field introduced to the device in the vicinity of the emitter-base PN junction. The device responds most strongly to magnetic fields having components directed perpendicular to the axis of carrier velocity and parallel to the emissive face or surface at which dominant injection occurs.

Turning to FIG. 1, a plan view of the operative portions of a transistor constructed according to the present invention is shown. It should be understood that the overlying shield electrode which also forms the emitter connection is not shown in FIG. 1. Furthermore, the collectors and emitter are understood to be embedded or implanted in a substrate forming the base of the transistor. Two separate heavily doped N-type collector diffusion regions 3 are illustrated spaced apart from one another by a distance of approximately 2.5 micro meters. A heavily doped N-type emitter diffusion 1 is separated laterally in the body of semiconductor material forming the base 2 by a P-type base region having a length W as shown. The length W is measured between the collector faces 3A and the emitter face 1A. It will be seen that, in this embodiment, both collectors 3 lie on the same side of the emissive face 1A of the emitter 1 relative to the emissive surface 1A.

The base region 2 is floating. That is, it is not electrically connected, but the emitter-base junction injects and is forward biased because of the holes produced in the avalanche process, thus effectively supplying proper polarity and magnitude to bias the emitter-base junction in to injection. Without base current being supplied, a negligible beta characteristic may be anticipated. However, due to the impact ionization promotion means 5, those carriers which are injected from the emitter and which successfully traverse the distance W will be multiplied by the avalanche phenomenon so that the overall effect of the transistor is approximately the same as a non-avalanching mode device operated with a base contact supplying base current.

An overlying shield 6 of metal is connected to ground and supplies the emitter potential through contact 7 to emitter 1. It also supplies, through a metal region overlying thin areas 5 in the silicon dioxide insulator 4, areas of increased electrical field between the shield and the collectors 3. These act to accelerate electrons traversing the base region 2 near the junction of the base with the collectors 3. The resulting carrier velocity is sufficient to cause impact ionization and avalanche generation of excess minority and majority carriers to occur.

In the embodiment illustrated, the emitterbase junction area oriented toward the collectors and identified as 1A is oriented parallel with the base collector junctions 3A which face it. In general, the collector PN junctions should be equidistant from the primary emissive surface (or surfaces) of the emitter 1. While a parallel configuration is shown, it is obvious that a circularly shaped emitter region and arcuately concentric collector elements could be employed as well. A rectangular emitter with U-shaped collectors about its ends is also approximately the same as the arcuate configuration. These will be described in greater detail as an alternative embodiment. Also, it is possible to develop the modulating Lorentz potential on one part of the emitter and supply its potential to the primary area as will be shown later.

As noted earlier, the device as shown in FIG. 1 responds most strongly to magnetic fields having a vector component perpendicular to the direction of injection of the carriers (along the X axis as shown in FIG. 1) and parallel with the primary emissive surface of the emitter 1A as shown in FIG. 1. An additional constraint is that the major dimension of the dominant Lorentz developing emissive surface 1A should preferably be bisected by an imaginary plane constructed perpendicular to the emissive face 1A. This plane bisects the major dimension, in this case in the Y axis direction, and passes through the Lorentz potential null point on the emissive surface. The magnetic vector components of greatest effect will be those lying parallel to the dominant Lorentz developing (and in this case, also the dominant or primary emissive area) emissive surface 1A, parallel to the bisecting imaginary plane (lying essentially along the X axis and bisecting the major dimension in the Y axis of the emissive surface 1A) and will be perpendicular to the vector direction in the X axis of the minority carriers injected by the emissive surface 1A. In other configurations where the Lorentz developing area is not the dominant emissive area, the geometrical constraints relative to the placement of the imaginary plane still apply to the Lorentz area, but may not apply to the primary emissive area to be modulated in injection.

To prevent the development of offset voltages, to is also preferred, although not necessary, that the individual collectors 3 be symmetrically located on opposite sides of the previously mentioned imaginary plane. That is, the separation between the two collectors 3 should be bisected by the same imaginary plane that bisects the major emissive surface dimension on the face 1A of the emitter 1. If this constraint is not fully met, a slight offset voltage due to the collection of more current at one collector than the other will occur. This can be easily balanced by varying slightly one of the load resistors $R_L$ shown in FIG. 1. Indeed, as will appear later, single collector devices can be constructed to operate quite well, and balancing can still be easily achieved.

Appropriate electrical potential is applied between ground and the collector contacts 8 through the load resistors $R_L$, and in avalanching devices, by the avalanche condition, to forward bias the emitter-base junction into injection of minority carriers and to reverse bias the base-collector junctions to collect the minority carriers. Those excess carriers which may be generated by the avalanche condition occurring in the region near the collector-base junctions due to the action of the accelerator electrode 6 are also collected. Bipolar devices not in avalanche require a base contact and power supply as will be described later.

The regions in FIG. 1 labeled $P_1$ and $P_2$ are the impact ionization promotor areas as described in my previously noted copending applications. They consist essentially of thinner areas in the oxide layer 4 overlying the surface of the substrate 2 which makes up the base of the transistor structure in this lateral embodiment.

Turning to FIG. 2, a cross-sectional view taken along the section line AA in FIG. 1 is illustrated for the preferred embodiment illustrated in FIG. 1. The emitter diffusion 1 and the collector diffusions 3 are separated by a distance W and have facing surfaces 1A and 3A oriented toward one another as shown. There are, of course, other surfaces of the emitter and collector diffusions as shown in FIG. 2. These surfaces could be the bottom as viewed in FIG. 2 or the rear surfaces facing away from one another and, of course, end surfaces not shown in FIG. 2. As will be described later, it has been found most desirable in this embodiment of the present invention to control or limit primary injection at the emitter to only one of its faces or to an area of one face only. The Lorentz potential may be developed there and applied to modulate injection or it may be developed at another injection area and applied to the primary area as will be shown. Various means are described for modifying the base by properly positioning the base contact or by adding means for limiting the predominant area of injection of minority carriers from the emitter to a preferred region or face thereof, or for favoring only a preferred area of the total emitter-base junction area.

The collector contacts 8 are not shown in FIG. 2 because of the position of the cross-section view taken from FIG. 1, but they may be understood to be similar to the connection 7 shown for the emitter contact. The thin region 5 in the oxide layer 4 is also visible in FIG. 2. Through the action of the electrode metal 6 which is connected to ground, carriers traversing the base region 2 near the collector base junction area are accelerated to cause impact ionization of the base material and concommitant generation of excess minority and majority carriers. The minority carriers are collected by the collectors 3 and appear as collector output current. As will be discussed below, the balance between the amount of current received at one collector versus the other can be modulated by a unique phenomenon occurring at the dominant emissive surface 1A.

The impact ionization promotion regions shown in FIG. 1 as $P_1$ and $P_2$ may also be constructed by a heavy P-type doping in the vicinity of the collector base junction facing toward the emitter 1. This generates a greater minority carrier acceptor concentration than the general P-type base region and will cause impact ionization to occur more readily at these base-collector PN junction areas.

The two identical load resistors $R_L$ are connected to the collector diffusions 3 through the collector contacts 8 as shown in FIG. 1. A voltage $V_{CC}$ above a critical value must be applied to cause impact ionization to occur at the collector-base junctions within the regions $P_1$ and $P_2$ shown in FIG. 1. The ionization process creates majority carriers (holes) which traverse the base width W and recombine with excess minority carrier electrons spontaneously injected at the emitter-base junction. The excess carrier recombination current thus occurring within the base 2 accounts for a majority of the emitter current. Emitter current will be seen to consist of the sum of the individual collector currents. If the device is constructed with a symmetrical layout as shown in FIG. 1, it may be assumed that essentially identical quiescent current operating conditions will occur in the absence of applied magnetic fields. That is, the two individual collectors 3 should experience approximately identical collector currents if they are symmetrically disposed with respect to one another and to the emissive surface or surfaces of the emitter 1.

Returning now to a discussion of the operative transduction phenomenon occurring in this device, some elaboration is necessary. Intuition would suggest perhaps that the application of a magnetic field directed perpendicular to the surface of a base region in FIG. 2 or FIG. 1 would cause a Lorentz force deflection of the electrons traversing the base region and unbalance the current. This would be further amplified by avalanche generation of excess carriers in the area of $P_1$ and $P_2$ which will eventually be collected by the individual collectors 3. Intuition might also suggest that such deflection would occur in such a manner such that the sum of the two collector currents would remain essentially constant. As will be shown subsequently, a substantial current imbalance is created at the collectors, but by a means entirely different than the intuitive mechanism suggested above. The actual transduction mechanism is more subtle and far more effective than the intuitive Lorentz deflection model and will be seen as a new and heretofore totally unknown effect.

For identifying and locating the operative transduction mechanism, many structures similar to FIG. 1 were fabricated. Various parameters were changed in the devices constructed. Such parameters were varying substrate resistivity, varying the promotion area for impact ionization, and varying the base widths and lengths. All of the devices operated as magnetically sensitive structures, but some were better than others. The fundamental problem hindering optimization of these devices stemmed from the lack of understanding of the magnetic transduction mechanism and the relationship of the transduction mechanism to the avalanche current and voltage properties of the structure.

To investigate the properties more fully, a unique experimental magnetically sensitive transistor structure was fabricated for test purposes. This structure is illustrated in FIG. 3 in a plan view similar to that of FIG. 1. It is illustrated in cross section in the section indicated as AA' in FIG. 3 by the cross-sectional view in FIG. 3A.

Figure 3:
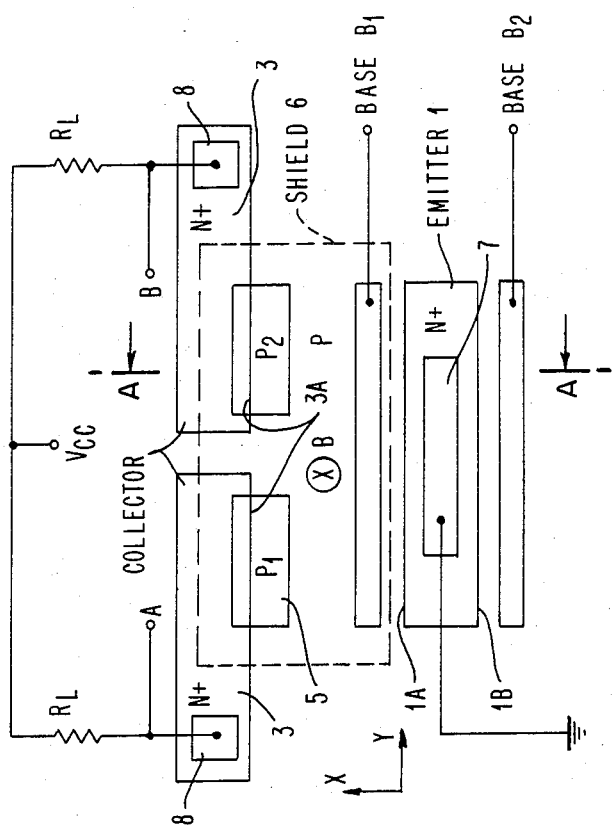
FIG. 3 illustrates in plan view an experimental version of the invention as depicted in FIG. 1 utilized for isolating the source of the magnetic transduction phenomenon.

With reference to FIGS. 3 and 3A, the device is essentially identical to the structure shown in FIGS. 1 and 2, except for the addition of two base contact regions $B_1$ and $B_2$. The other elements in these figures are the same as those in FIGS. 1 and 2. For the device illustrated in FIG. 3 the base length, i.e., the distance between the emitter and the base contacts was chosen as approximately 25 micrometers. This basic length yielded a vertical VI characteristic in avalanche similar to that shown in FIG. 4.

A series of critical experiments was performed in two parts. In the first part, an external variable resistor was connected between ground potential and the base contact $B_1$.

During this portion of the experiment, the base contact $B_2$ was left floating. In the second portion of the experiment, the variable resistance was connected between ground and the base contact $B_2$, leaving the base contact $B_1$ floating. In both portions of the experiment, a sinusoidal magnetic field described as $400 \sin(120\pi t)$ gauss or $4.0 \times 10^{-2} \sin(120\pi t)$ tesla was introduced parallel with the Z axis normal to the surface of the base region of the transistor. During this time, the value of the resistive connection through the resistor to ground was varied.

Figure 5:
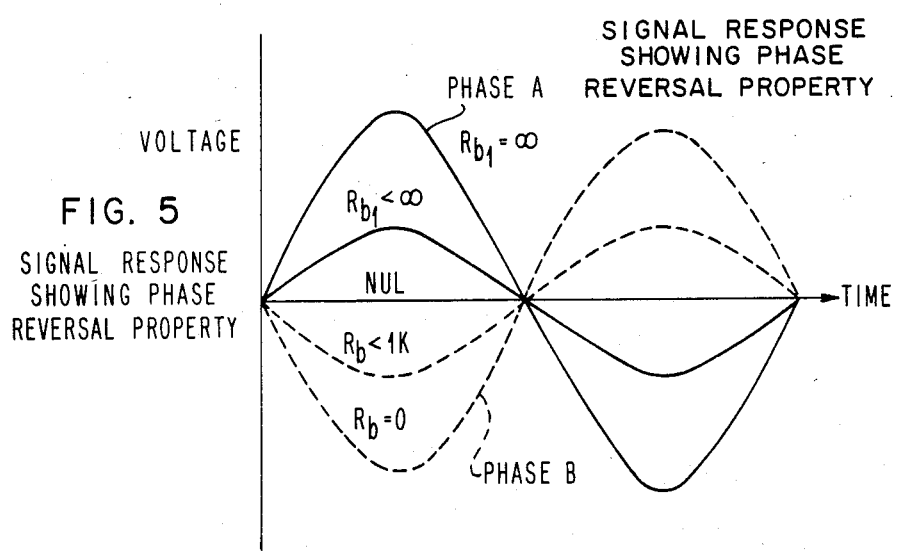
FIG. 5 illustrates the signal response obtained from a device like that illustrated in FIG. 3 under circumstances of connecting one or the other of the base contacts to ground through a variable resistance.

A startling result was obtained during the first phase of this experiment. Specifically, the amplitude of the magnetic response signal measured between the two collectors passed through a null point and then the signal output changed phase as the value of the resistor connected between ground and the base contact $B_1$ was varied. The result is sketched in FIG. 5.

The signal null obtained was absolute. The only signal observed was that of random noise at this point. This experimental observation led to the suggestion that magnetic transduction mechanisms operative in the device must be located somewhere near or within the emitter depletion region because of the proximity thereto of the experimental separate base regions. The hypothesis to account for this observed variation of phase and amplitude in the output signal was developed as follows.

Let it be supposed that injection from the emitter is modulated along the major axis of the emissive surface (or that in which dominant injection occurs) taken along the width of the emitterbase junction 1A or 1B. The modulation may be by means of the Lorentz potential which is created in the Y axis by the action of the Z directed magnetic field components interacting with the X directed vectors of the minority carriers injected at these surfaces of the emitter.

In FIGS. 3 and 3A, the axis coordinates are defined and are adhered to henceforth herein. The X axis is chosen as the direction of the velocity vector of the minority carriers leaving perpendicular to the emissive surface and moving toward the collector (or away from it initially if the carriers are emitted on the back face of the emitter). The Y axis is chosen transverse to the minority carrier velocity vector. The Z axis is directed perpendicular to the plane of the X and Y axes, or normal to the substrate surface for the lateral device as shown in FIGS. 1–3.

Injection will be occurring around the entire surface of the emitter-base PN junction and may be assumed to occur in the front face 1A, the rear face 1B, the bottom surface and the end surfaces as well. We will momentarily consider only that injection occurring along the front and back faces 1A and 1B for simplifying the present description. Injection from the bottom surface can be neglected for this comparison (but is important in other models) since the cross product against magnetic vectors directed to the Z axis will be zero and no Lorentz field potential will be generated by vectors oriented thusly with respect to the bottom surface of the emitter. The end surfaces are neglected due to their small size relative to the dominant area of injection along the long axis and major dimension of the dominant emissive area.

It will be observed from a review of FIGS. 3 and 3A that the X-directed vectors of carriers leaving the emitter surfaces 1A and 1B will be in opposite directions. If the Lorentz field potential is developed at the emitter-base junction areas along the Y axis due to the interaction of these injected carriers and the magnetic field component in the Z axis, then the polarity of the Lorentz potential voltage developed along the width of the emitter face will be opposite on the front face 1A to that developed along the rear face 1B. This is illustrated in FIG. 1 for example by the notation $V_L$ and the positive and negative signs located along the emissive faces of emitter 1.

It should be clearly understood that Lorentz field potential is quite different from the Lorentz force. Lorentz potential does not involve current and is a function only of carrier velocity and magnetic flux vector intensity. Lorentz force on the other hand, is a function of current.

Thus, it may be understood that the Lorentz field produced by injection of minority carriers which are interacting with the Z axis directed magnetic field components will be of a given value regardless of the number of electrons or minority carriers actually injected.

It will be assumed for the time being that this Lorentz field potential, produced either at the dominant injection area or elsewhere, may modulate the injection of minority carriers along the dominant emitting surfaces. If the field acts with or against the junction potential occurring at the emitter-base junction, a higher proportion of minority carrier injection would be seen to occur at the end of a face of the emitter where the Lorentz potential is positive and that lower injection would occur at the opposite end of the same surface where the Lorentz field acts opposite to the junction potential. That is, at one end of the emitter surface, the Lorentz field potential would tend to enhance the forward bias potential and cause a heavier injection rate of minority carriers; at the opposite end of the same surface it would tend to reverse bias the junction potential and reduce the amount of injection occurring there.

If it is assumed that both the front and rear faces of the emitter, 1A and 1B respectively, might inject carriers with equal current density and both are subject to the same magnetic field components, then there should be no net magnetic response signal measured between the collectors. The effects should be observable since oppositely directed Lorentz potential injection modulation effects would cancel one another at the collectors. If, however, total injection were found to be different along the front or rear emitting face, then a magnetic response signal should be measured between the collectors, regardless. It may be seen that the polarity or phase of the output response signal would depend on whether injection was dominant along the front or rear face of the emitter. This is so because the carriers most predominantly emitted from the front or the rear would be most heavily emitted at the left or the right as shown by the positive signs in FIG. 1 and would traverse the distance to the collector through the base material. Their movement towards the collectors is essentially without interaction or significant Lorentz force deflection as will be seen later, and except for recombination with majority carriers which may be assumed to occur at a more or less equal rate, they will reach the collector areas.

It may be assumed that the dominant injection of minority carriers will occur at the emitter-base junction surface facing the collectors and that the Lorentz field modulation of the injection proportions could be detected with the base contacts $B_1$ and $B_2$ left floating. Any dominance of injection from the front face versus the rear face would result in an arbitrarily designated phase A magnetic response signal measured between the collectors. Connecting the base contact $B_1$ to a resistor connected to ground would terminate some of the holes traversing the base region which originated within the ionization interval near the collectors. The local recombination rate would lower injection along the front face of the emitter-base junction with contact $B_1$ thus connected. This would leave injection at the rear face 1B essentially unaltered.

Figure 4:
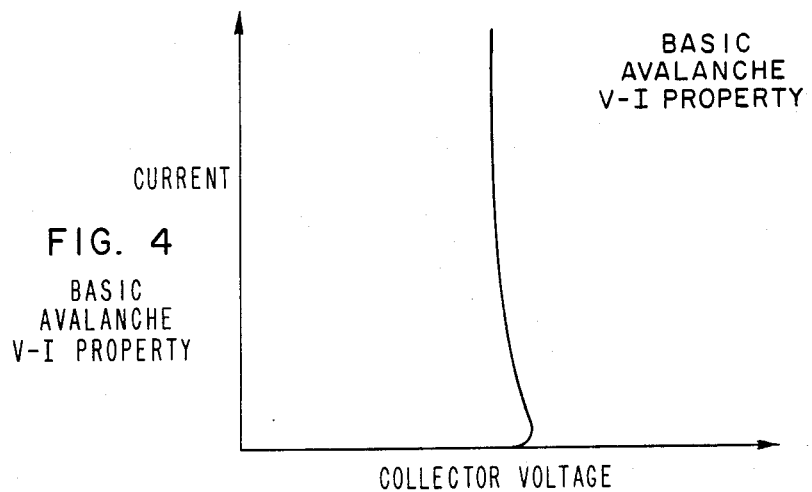
FIG. 4 illustrates the basic voltage and current property for transistors of the avalanche type in the present invention.

As may be seen from the foregoing assumtions and the demonstrated experimental result, the null output signal in FIG. 4 would correspond to identical injection and modulation levels at both the front and rear faces of the emitter base junction. A reduction in the level of injection from the front face relative to that at the rear face of the emitter base junction would cause injection modulation, if any occurs, to occur at the rear face and dominate the signal behavior measured between the collectors. The observed phase reversal of the output signal response measured in the experiments is thus in agreement with the hypothetical model and proposed physical explanation. One may now speculate what should be observed experimentally if the base contact $B_2$ were connected to ground through a variable resistor while base contact $B_1$ were left floating. If it is assumed as before that the base open configuration allows emitter injection and modulation, if any, to dominantly occur along one face or the other of the emitter base junctions, then lowering the injection occurring at the rear surface should enhance the magnetic signal due to the injection occurring at the front surface. Such a result has been confirmed experimentally. The phase A signal response is more than doubled when the base contact adjacent the rear surface 1B is connected to ground. Thus, it may be seen that if the phase B signal is removed, the phase A signal is increased. It is believed that the experiment just described clearly demonstrates the general location and nature of the magnetic transduction mechanism as Lorentz potential modulation of emitter injection. As will be seen later, the position of the base contact relative to the emitter is an important means of controlling or limiting the area at which dominant injection occurs from the emitter.

The remaining problem is that it is desirable to discover where the Lorentz modulation of emitter injection may occur, whether it be within the emitter depletion region or just outside that region.

Returning to FIG. 1 for a discussion of Lorentz field modulation of emitter injection, the collector currents for the left and right collectors 3 may be simply stated as $I_{c1}$ and $I_{c2}$. These may be shown to be related to the equivalent leakage current by expressions 1 and 2.

$$I_{c1} = I_{O1} e^{\frac{qV_{be}^*}{KT}} \quad (1)$$

-continued $$I_{c2} = I_{O2} e^{\frac{qVbe^*}{KT}} \quad (2)$$

Where:

$I_{O1}$ is the equivalent leakage current at the left collector.

$I_{O2}$ is the equivalent leakage current at the right collector.

$V_{be}^*$ is the base-emitter voltage consisting of the sum $V_{fb}+V_L(y)$ i.e.—the base emitter forward bias potential due to avalanche conditions plus a Lorentz potential $V_L(y)$.

The Lorentz potential available for injection modulation is the Lorentz voltage $V_L$ directed along the Y axis in FIG. 1. It is distributed along a contour which corresponds to the width of the emitter-base junction on the surface facing toward the direction of the collector surfaces. Given a Z-directed magnetic field and an X-directed carrier velocity vector, the Lorentz potential contour will be developed parallel to the Y coordinate across the face 1A of the emitter 1.

The origin of the coordinate system shown in FIG. 1 is chosen to be the center of the emitter-base junction area which faces the collectors. The Lorentz potential is zero (null) at the coordinate origin due to the symmetry consideration. It will be recalled that the collectors and the emitter are oriented with respect to one another so that an imaginary plane bisecting the maximum Lorentz-developing emissive surface 1A and perpendicular to the surface 1A will divide the two collectors 3 symmetrically one from another in the preferred embodiment. This plane, it will be seen, will also pass through the Lorentz potential null or zero along the emissive face 1A. It should be emphasized here that this Lorentz potential is developed across the same area which is the primary injection area, but it could be developed elsewhere and applied to the primary injection area.

The magnitude of the Lorentz field E(y) depends on the vector cross product of carrier velocity in the X axis (which is an axis normal to the emitting surface 1A) and upon the magnetic field component $B_z$ directed normal to the surface of the base region. This magnetic field vector will be seen to be parallel to the imaginary plane intersecting the emissive surface 1A and parallel with the emissive surface itself. The magnitude of the Lorentz field depends upon width of the area and on the average carrier velocity, not on the number of carriers. As pointed out earlier, it is necessary to carefully observe that the Lorentz field potential is not dependent upon current whereas the Lorentz force is.

The Lorentz potential $V_{L2}$ developed along the right half of the emitter 2PN junction surface facing toward the collector having an ionization promoter P2 can be expressed as follows:

$$V_{L2} = \int_o^{Y_o/2} (V_x \times B) dy = \hat{\mu}y \cdot \frac{(V_x \times B_z) Y_o}{2} \quad (3)$$

The Lorentz potential $V_{L1}$ developed along the left half of the emitter PN junctionl surface facing toward the collector having ionization promoter P1 is expressed as:

$$V_{L1} = \int_o^{-Y_o/2} (V_x \times B_z) \cdot dy = -\hat{\mu}y \cdot \frac{(V_x \times B_z) Y_o}{2} \quad (4)$$

where: $\hat{\mu}y$ is a unit vector induction y.

It is evident from these expressions that the Lorentz field potential will increase linearly with increases in the Y axis dimension of the emissive surface. The average Lorentz field potential developed along either half of the injecting emitter surface will be one-half the value developed at a position measured along the Y coordinate at $\pm Y_o/2$. Thus, these average Lorentz field potentials can be expressed as shown in expressions 5 and 6:

$$\overline{V}_{L2} = \frac{V_x B_z Y_o}{4} \quad (5)$$

$$\overline{V}_{L1} = \frac{-V_x B_z Y_o}{4} \quad (6)$$

Where $Y_o$ is the maximum total width of the emitter. It is evident that some maximum Lorentz potential will be developed for any given arrangement of carrier velocity vector and flux field direction that will be a maximum across the maximum dimension of the emitter surface perpendicular to the vector for carrier velocity.

Equations (1) and (2) previously given may now be expanded in view of the definition given for the base to emitter potential voltage. The new voltage will equal the base-emitter forward bias voltage plus the Lorentz field potential as shown by expressions 7 and 8.

$$I_{C1} = I_{O1} e^{\frac{qV_{fb}}{KT}} e^{\frac{-qVL(y)}{KT}} \quad (7)$$

$$I_{C2} = I_{O2} e^{\frac{qV_{fb}}{KT}} e^{\frac{qVL(y)}{KT}} \quad (8)$$

Expressions 7 and 8 may be further simplified by recognizing that the coefficient $I_{O1}$ as multiplied by the first exponential term in the equations is simply the quiescent collector current $I_{co}$. Thus:

$$I_{c1}(y) = I_{c1o} e^{\frac{-qVL(y)}{KT}} \quad (9)$$

$$I_{c2}(y) = I_{c2o} e^{\frac{qVL(y)}{KT}} \quad (10)$$

Where:

$$I_{c1o} = I_{c2o} = I_o e^{\frac{qV_{fb}}{KT}} = I_c$$

Taking the difference between equations (9) and (10) yields the differential current as shown by expression (11):

$$\Delta I_c = 2I_c \text{Sinh}\left(\frac{q\overline{V}_L}{KT}\right) \quad (11)$$

where $\overline{V}_L$ is the average Lorentz potential.

In expression (11) it may be noted that the factor $2I_c$ is equal to the emitter current $I_e$ given a base open configuration. It is appropriate, however, to express the differential current in terms of collector current, not emitter current. The two currents differ by the value of the base current $I_b$. By substituting expression (5) into expression (11), one obtains expression (12):

$$\Delta I_c = 2I_c \text{Sinh}\left(\frac{qV_x B_z Y_o}{4KT}\right) \quad (12)$$

From the foregoing expression, it is apparent that the Lorentz potential modulation of emitter injection can be a very efficient transduction mechanism, indeed. Optimization of the sensitive axis of response depends upon controlling the location of the emitter injection, or at least of the dominant portion of the emitter injection.

The Lorentz potential differential will be transformed exponentially into a current differential for which the maximum efficiency of current transformation is defined as shown by expression (13):

$$\text{Max Efficiency } \frac{\Delta I}{2I_c} = \text{Sinh}\left(\frac{qV_x B_z Y_o}{4KT}\right) \quad (13)$$

As is evident from expression (12), the differential current induced in the device as shown in FIG. 1 will, for a given magnetic field strength in the Z axis and a given emitter width $y_o$, depend upon the carrier velocity. Injected carriers are normally injected perpendicular to the surface formed by the emitter base junction and hence, their velocity vector will be directed normal to that surface. It is evident from expression (11) that differential current will vary linearly with the Lorentz potential provided that the Lorentz potential is less than $KT/q$.

The differential magnetic signal voltage measured between the collector terminals A and B in FIG. 1 is not simply the product of the signal current shown in expression (12) and the value of the load resistor $R_L$ in FIG. 1. Because the lateral transistor as shown in FIG. 1 is operated in the avalanche mode, a relatively low impedance is developed between the collectors. The impedance is defined as the avalanche resistance $R_A$ and is on the order of 500 ohms at nominal collector currents of two or three milliamps. The avalanche resistance is typical of devices exhibiting essentially a vertical VI property like that shown in FIG. 4.

The avalanche resistance for a given device can be easily measured in the laboratory by observing the deviation in the avalanche collector potential as a function of collector current in response to an externally applied base current. Introducing external base current simulates the change in collector voltage in response to modulating emitter injection. The fact that the avalanche resistance is relatively low in value minimizes the effects of stray capacitance and therefore partially accounts for the high frequency capabilities of devices of this type.

The 500 ohm figure for avalanche resistance $R_A$ will be used throughout the analysis sections which follow, its derivation being the substance of a future paper, but being unnecessary for the present invention since the actually observed resistances can be utilized for the analysis.

A hypothetical explanation for the observed phenomenon and an experimental demonstration appearing to verify the hypothesis have been given which tend to show that the magnetic transduction mechanism appears to be located at the emitter base PN junction. Expression (12) above describes the differential collector current induced by application of a magnetic field in the region in question. A question still to be answered by this portion of present discussion is what carriers are involved in the Lorentz potential and precisely where are they located?

In expression (12) all of the parameters are known except for the carrier velocity directed along the X axis. The purpose of this section of this treatise is to show that the carriers traversing the emitter space charge region are responsible for the Lorentz potential modulation of emitter injection and not those carriers diffusing from the emitter and recombining in the base outside the emitter depletion region. To demonstrate this hypothesis, the average diffusion velocity of the carriers just outside the emitter depletion region due to excess carrier diffusion and recombination effects will be calculated. This expression for velocity will then be substituted in expression (12). An expression for the differential output voltage will be developed and compared with the actual experimental result.

Following this comparison, a computation will be made for the same output signal potential that would result if the carriers traversing a portion of the emitter depletion region reached the maximum thermal saturation velocity of approximately $10^7$ centimeters per second.

Returning to the first part of this proposed analysis, assume that the average velocity of the carriers traversing the emitter depletion region is due to the diffusion current at the emitter edge of the base region. The intense electric depletion field will be ignored in this analysis since, for this circumstance, the current flowing in the emitter depletion region is identical to the diffusion current at the edge of the emitter depletion region. Thus, $$I_e = N_b'(o) Aeq\bar{V} = AeqD^*\left(\frac{\partial P_b'(x)}{\partial x}\bigg/_{x=o} - \frac{\partial N_b'(x)}{\partial x}\bigg/_{x=o}\right) \quad (14)$$

Solving (14) for average velocity $\bar{V}$ gives:

$$\bar{V} = \frac{D^*}{N_b'(o)}\left(\frac{\partial P_b'(x)}{\partial x}\bigg/_{x=o} - \frac{\partial N_b'}{\partial x}\bigg/_{x=o}\right) \quad (15)$$

Where:

$$N_b'(o) = N_{bo}\left(e^{\frac{qV_{eb}}{KT}} - 1\right)$$

$$N_{bo} = \frac{N_i^2}{NA}$$

$$D^* = \frac{KT}{q}\mu^*$$

$\mu^*$ = The effective mobility of the excess holes and electrons created within the base region by the collector avalanche conditions.

$N_b'(x)$ = Concentration of excess minority carriers within the base region as a function of position.

$P_b'(x)$ = Concentration of excess majority carriers within base region as a function of position.

The polynomial expressions for excess carriers have been developed in another paper and are summarized below. Their derivation is not essential to the present invention and is thus omitted.

$$N_b'(x) = N_b'(o)\left(1 - a\frac{x}{w}\right)^n \tag{16a}$$

$$P_b'(x) = N_b'(o)\left(1 + a\left(\frac{x-w}{w}\right)\right)^n \tag{16b}$$

Where
$a = 1 - \alpha_t$
$\alpha_t$ = Carrier transport factor
$w$ = length of lateral base region.

By taking the derivative of the expressions (16a) and (16b) and evaluating the expressions for the given position on the x axis where x is 0 yields the following:

$$-\frac{\partial N_b'(x)}{x}\bigg/_{x=0} = nN_b'(o)\frac{a}{w} \tag{17a}$$

$$\frac{\partial P_b'(x)}{x}\bigg/_{x=0} = nN_b'(o)\frac{a}{w}\alpha_t^{n-1} \tag{17b}$$

For typical avalanche conditions, the current transportation factor $\alpha_t^{n-1} << 1$ is much less than one and hence the expression described by equation (17a) will be the dominant factor.

By substituting expression (17a) into expression (15), we obtain an expression for the average diffusion or recombination velocity, expressed:

$$\bar{V} = \frac{nD^*a}{w} \approx \frac{nD^*}{w} \tag{18}$$

$$a = 1 - \alpha_t$$

Evaluating expression (18), one finds that the average diffusion velocity of $2 \times 10^4$ centimeters per second is reasonable for minority carriers leaving the edge of the emitter depletion region. Neglecting temporarily the fact that the exponent n depends on current, the diffusion velocity given by expression (18) is essentially independent of collector current.

Substituting expression (18) into expression (12) and replacing $D^*$ with $(KT/q)\mu^*$ yields the following expression for differential collector current:

$$2I_c = 2I_o \sinh\left(\frac{ny_o}{4w}B\mu^*\right) \tag{19}$$

Multiplying expression (19) by the avalanche resistance factor $R_A$, yields the following expression for the signal output voltage:

$$\Delta E = 2R_A I_o \sinh\left(\frac{n}{4}\frac{y_o}{w}B\mu^*\right) \tag{20}$$

Equation (20) is evaluated below for the following nominal conditions.
$R_A = 500$ ohms
$I_o = 3 \times 10^{-3}$ amps
$n = 4$
$y_o/w = 1$
$B = 10^{-8}$ volt-sec/Cm² per gauss
$\mu^* = 500$ Cm²/volt-sec.

From which $$\Delta E = 1.5 \times 10^{-5} \text{ volts/gauss} = 0.15 \text{ volts/tesla} \tag{21}$$

The output signal voltage $\Delta E$ is two orders of magnitude below that actually measured in the laboratory. It may therefore be concluded that the recombination velocity $\bar{V}$ is too low to account for the measured device sensitivity.

Figure 6:
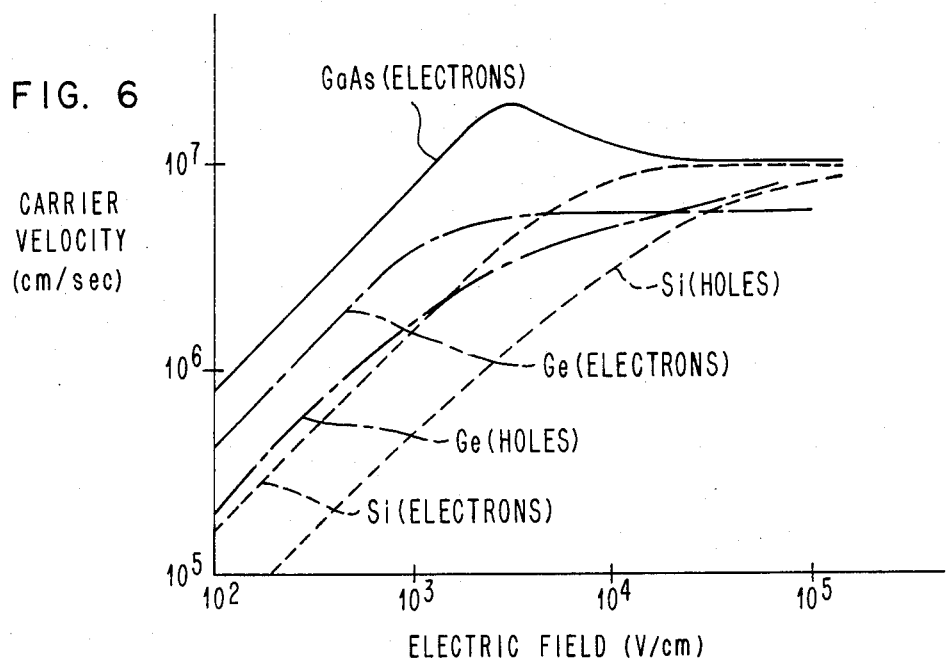
FIG. 6 illustrates carrier velocity versus electric field for various semiconductor materials.

We will now consider the output voltage predicted for this device as shown in FIG. 1 if the carriers traversing a portion of the emitter depletion region are sustained at or near the thermal saturation velocity of approximately $10^7$ centimeters per second (see FIG. 6 for the typical carrier velocities versus electrical field strengths known to exist for semiconductor materials).

For this case, expression (12) becomes $$\Delta E = 2R_A I_o \sinh\left(\frac{q}{4KT}V_s B_z Y_o\right) \tag{22}$$

Evaluating expression (22) yields $$\Delta E = 3.5 \times 10^{-3} \text{ volts/gauss} = 35 \text{ volts/tesla} \tag{23}$$

Where:
$R_A = 500$ ohms
$I_o = 3 \times 10^{-3}$ amps
$KT/q = 0.026$ e.v.
$V_s = 10^7$ cm/sec
$B_z = 10^{-8}$ volt-sec/cm²
$Y_o = 1.2 \times 10^{-3}$ Cm The differential magnetic signal voltage predicted by expression (23) is very close to the value actually measured of approximately 3 millivolts per gauss.

Based upon the experimental evidence and the above calculations, it is concluded that the magnetic transduction mechanism lies within the emitter-base depletion region and specifically near the stochastic PN junction where both the depletion region field and the carrier velocities reach a maximum value.

It is also important to recognize that the carrier velocity is directed normal to the injecting surface of the emitter.

The carrier velocity in the emitter depletion region is next investigated. FIG. 6 is a typical plot of carrier velocity versus electric field for electrons and holes in both silicon and gallium arsenide. The plot was obtained from page 59 of "Semiconductor Physics" by Sze, a common reference work in the field. From this reference, it is quite apparent that electrons may remain at thermal saturation velocity for fields as low as $1 \times 10^4$ volts per centimeter. However, holes in silicon require fields of approximately $10^5$ volts per centimeter to achieve the same thermal velocities. Based upon this observation and upon experience with both NPN and PNP silicon magnetic transistor structures, gallium arsenide would appear to have the most promise for high velocity and field characteristics for use with either avalanching or non-avalanching devices according to the present invention. A saturation velocity of $2 \times 10^7$ centimeters per second is predicted for electrons in gallium arsenide at fields of approximately $4 \times 10^3$ volts per centimeter. This material continues to exhibit velocities of $10^7$ centimeters per second given fields as low as $10^3$ volts per centimeter.

Consideration now will turn to how the forward biased emitter-base junction potential is influenced by the avalanche condition or by base current and how the field within the depletion region behaves with the net bias potential. Bipolar and avalanche types of devices are thus both involved.

A collector current flowing in an avalanche device is essentially due to recombination of excess carriers generated by impact ionization. As has been shown in my previously mentioned copending patent applications, excess carrier recombination currents equal to the difference between diffusion current at the extreme ends of the base region, that is at a position $X=0$ and $X=W$. The diffusion current at $X=W$ is reduced from the injection current by the transport factor $\alpha_t^{n-1}$. For normal avalanche current levels below complete destruction, the diffusion current at $X=W$ is insignificant compared to that at the emitter PN junction which is at the $X=0$ position because the transport factor is much less than 1 at the collector end of the base region. Consequently, the collector current flowing in a base open avalanche transistor device can be closely approximated by examining the diffusion current at the $X=0$ position; therefor, $$I_c = q A_c D^* \frac{\partial N_b'(x)}{\partial x} /_{x=o} \quad (24)$$

Equation (24) is evaluated as follows in view of the expression (17a).

$$I_c = N A_e q D^* N_b'(o) \frac{a}{w} \quad (25)$$

Solving expression (25) for $N_b'$ (o) yields $$N_b'(o) = \frac{WI_c}{N A_e q a D^*} = \frac{N_i^2}{N_A} \left( e^{\frac{qV_{be}}{KT}} - 1 \right) \quad (26)$$

And solving expression (26) for the forward bias potential $V_{fb}$ yields:

$$V_{fb} = \frac{KT}{q} Ln \left( 1 + \frac{N_A N_b'(o)}{N_i^2} \right) \approx \quad (27)$$

$$\frac{KT}{q} Ln \left( \frac{N_A N_b'(o)}{N_i^2} \right)$$

The base emitter contact potential $\psi$ is known and is given as follows.

$$\psi = \frac{KT}{q} Ln \left( \frac{N_A N_D}{N_i^2} \right) \quad (28)$$

Taking the difference between $\psi$ and $V_{fb}$ yields the following expression for the net potential developed across the emitter base junction.

$$\psi - V_{fb} = \frac{KT}{q} Ln \left( \frac{N_D}{N_b'(o)} \right) \quad (29)$$

for $N_i^2 << N_A N_b'(o)$

This expression is essentially the same for avalanching and non-avalanching magnetic transistor devices according to the presence invention. It is desirable for a given collector current $I_c$, that the device maintain as large a net junction potential as practical in order to maintain high depletion region fileds and high carrier velocities. The electric fields $\epsilon_o$ developed at the stochastic emitter base junction due to the ionized acceptors and donors $N_A-$ and $N_D+$ respectively, is given below in terms of the net junction potential ($\psi - V_{fb}$).

$$\epsilon_o = \left( \frac{2q}{e_s} (\psi - V_{fb}) \frac{N_D N_A}{N_D + N_A} \right)^{\frac{1}{2}} \quad (30)$$

Where:
$N_D$=donor concentration of emitter
$N_A$=acceptor concentration of base.

By substituting expression (29) into expression (30) and assuming that $N_D$ is much much greater than $N_A$ yields the following:

$$\epsilon_o = \left( \frac{2q}{e_s} \frac{KT}{q} Ln \left( \frac{N_D}{N_b'(o)} \right) N_A \right)^{\frac{1}{2}} \quad (31)$$

Fields as intense as $10^4$ volts per centimeter can be realized given typical collector current conditions, it is apparent from expressions (29) and (31) that it will be desirable to heavily dope the emitter region in order to maintain relatively intense junction fields.

It is also evident from expression (29) that the emitter will cease to inject electrons if the minority carrier concentration $N_b'(o)$ equals the donor concentration $N_D$. Furthermore, the electric field within the emitter depletion region will diminish together with carrier velocity as the minority carrier concentration given in expression (26) approaches the donor concentration $N_D$. For this reason, it is desirable to have the emitter dopant levels greater than $10^{19}$ Cm$^{-3}$.

From all of the foregoing analysis, it is apparent that the most useful devices will employ some means for controlling the region at which the dominant emitter injection of minority carriers occurs so that a modulated signal without degradation from other areas can be achieved. Some means must be developed for controlling or tending to limit the dominant area of injection of emitter-base junction area to some portion less than that of the total area. As will be seen shortly, several such means have been found. However, it is first necessary to more fully consider the effects of injection from other areas of the emitter which may not contribute to the desired output.

Referring momentarily to expression (12), it is evident that the differential magnetic signal current is at least proportional to the following factors: collector current, carrier velocity and the width $Y_o$ of the Lorentz contour portion of the emissive surface developing the Lorentz voltage. The analysis that developed expression (12) neglected all the degenerate injection at the emitter base junction.

Degenerate injection does not lead to a signal current at the collectors or may actually lead to an opposing signal component if any. It can be shown that non-opposing degenerate emitter injection diminishes the current transduction efficiency given by expression (13) by a factor related to the emissive area as a portion of the total area defined by the following expression:

$$\frac{\Delta I}{2I_c} = \frac{A_e^*}{A_e} \sinh\left(\frac{qV_L}{KT}\right) \tag{32}$$

Where:
$A_e^*$ is the emitter area where Lorentz voltage modulation of injection occurs and leads to phase A type response.
$A_e$ is the total injecting emitter area. Portions of the injecting emitter region may not be perpendicular to the desired magnetic field.

The experiments described above in connection with the device shown in FIG. 3 demonstrated that the controlling or approximate restricting of emitter injection to a preferred area facing the collectors should be allowed and that injection elsewhere on the emitter base junction should be suppressed or discouraged, except for the purpose of developing a controlling Lorentz potential. It is shown by expression (12) that the differential current $\Delta I$ is directly proportional to the modulatable collector current.

Equation (25) given above describes the emitter current in terms of the minority carrier concentration injected into the base at the X=position. For a given emitter-base forward bias potential, the minority carrier injection rate is inversely controlled by acceptor concentration $N_A$ at that junction. This situation is summarized by expression (33).

$$I_c = NA_e qD^* \frac{a}{w} \left(\frac{N_i^2}{N_A}\right) \left(e^{\frac{qV_{be}}{KT}} - 1\right) \tag{33}$$

Degenerate magnetic signal components arising from injection at the emitter junction areas not facing toward the collectors or not responsive to Lorentz injection modulation effects can and should be suppressed. Suppression may be accomplished by providing a heavily doped acceptor region of P+type around the emitter diffusion and beneath it, in fact surrounding it except along the junction face high injection and Lorentz injection modulation are desired. The technique of localized injection limiting means is illustrated in FIG. 7A. It should be clearly understood that, for purposes of generating a Lorentz potential to be used for modulating injection from the primary injection area, it is not necessary to have a high level of injection. Only a relatively low level of high velocity carrier injection is necessary in the Lorentz potential area in order to develop a highly effective modulating potential for application to the primary injection area.

In FIG. 7A, a plan view of a device similar to that shown in FIGS. 1-3 and including a P+injection suppression pocket zone 9 is shown surrounding all but the face 1A of emitter 1. A cross-section taken through the device shown in FIG. 7A appears in FIG. 7B where the nature of the P+pocket may be better understood. The emitter diffusion 1 is positioned relative to the P+pocket 9 so that the portion of the emitter base junction area facing toward the collectors 3 is outside of the P+pocket. This leaves the face 1A exposed and all other surfaces of the emitter diffusion lie within the pocket. The emitter P+pocket region should have at least one order of magnitude greater acceptor concentration than the normal P+type base region 2 where injection is desired.

Figure 8A:
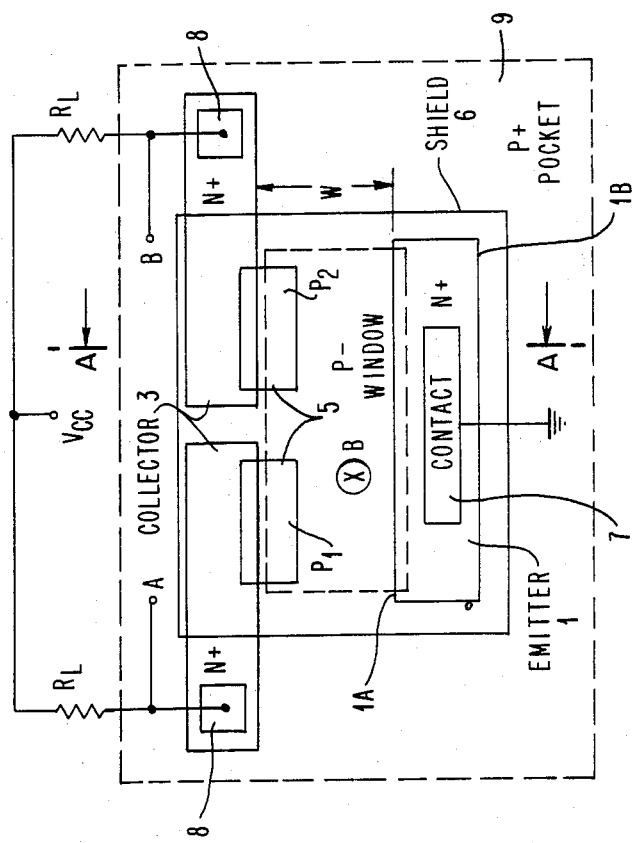
FIG. 8A illustrates an alternative preferred embodiment of the invention employing means for approximately limiting injection to the preferred front face of the emitter facing the collectors.
Figure 8B:
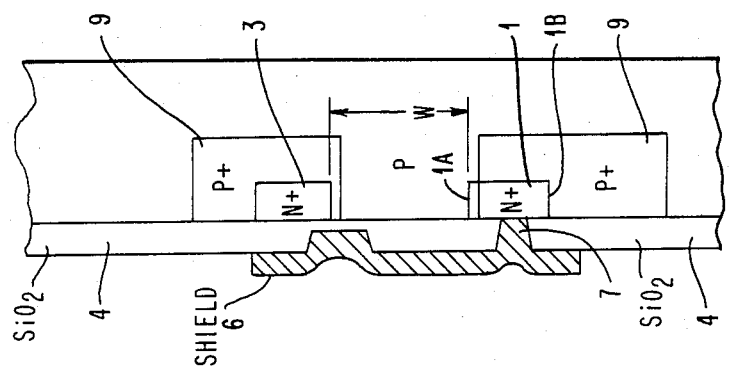
FIG. 8B illustrates a horizontal cross-section of the device in FIG. 8A.

Alternative means for localizing injection to occur predominately in a selected region of the emitter base PN junction are illustrated in FIGS. 8A and 8B. In the configuration shown in FIG. 8A, the silicon substrate 2 which forms the base material is provided with a blanket acceptor ion dosage to form a continuous concentrated acceptor pocket everywhere within the substrate 2 except in the region of the base which separates the front face 1A on the emitter 1 facing toward the collector base junctions. The blanket P+pocket is deep enough as shown in FIG. 8B to also prevent significant minority carrier injection at the bottom face of the emitter diffusion.

There is another method which may be used to affect or control some degree of localized emitter injection. This control means depends on the position of the contact made to the base region of devices operated below avalanche conditions. For example, consider the lateral bipolar transistor shown in FIG. 1. The contact for the base (not shown is made in back of the collectors and close to the collector diffusions. The length of the base contact region is essentially equal to the length of the emitter diffusion. The base contact is parallel to the collectors and to the emitter and farther from the emitter than from the collectors. Positioning the base contact in this manner tends to favor injection at the emitter-base junction area facing the collectors. Intuition would also suggest that placing the base contact between the emitter and collector would favor injection at the front of the emitter as desired. However, it has been discovered experimentally that this technique leads to very high levels of injection noise.

It has also been discovered experimentally that the same lateral bipolar transistor of FIG. 1 can be caused to exhibit vertical injection properties, i.e., dominant injection at the bottom surface of the emitter diffusion. This behavior was accomplished by placing the base contact in back of the collectors (i.e., the collector lies between the base and the emitter) as described previously. However, the contact position must be a considerable distance away from the emitter, typically a distance in the order of the substrate thickness. A similar result can be achieved by making the base contact on the back side of the substrate directly below the emitter. It is desirable to place the base contact farther away from the emitter than from the collector and, preferably, to have the collector between the base contact and the emitter.

This base contact control technique leads to operational bipolar transistor devices which are sensitive to magnetic fields directed parallel to the dominant injecting surface. However, the results of using this technique alone are inferior to those achieved by regionally controlling injection. As noted earlier, this may be done either by inhibiting injection elsewhere, by increasing the doping level within the base region surrounding selected surfaces in contact with the emitter diffusion or by enhancing injection by selective doping.

Both injection control techniques may be practiced simultaneously with excellent results, and, in the preferred embodiments described later, both techniques are used.

The foregoing means for limiting the dominant area of injection of minority carriers from the emitter to a specified smaller portion of the total emitter base junction provide a way of maximizing the ratio given in expression (32) as $A_e^*/A_e$.

Optimization of this ratio leads to the most sensitive uniaxial magnetic sensing devices.

There are certain implications of the basic transduction mechanism just described. The basic mechanism is shown to be Lorentz field modulation of emitter injection. It was discovered by exploring the different avalanche type magnetic transistor configurations. The details leading to the discovery were given above. Utilization of the fundamental mechanism is not restricted, however, to avalanche devices or to avalanche device behavior.

Many optimum dual or single collector bipolar transistor configurations have been constructed according to the present invention utilizing this mechanism. These sensor configurations are basically four (or three with a single collector) terminal devices as opposed to the three terminal, two collector devices typical of avalanche transistor structures because the base contact must be provided with current.

Two basic non-avalanching transistor configurations both in lateral and in vertical or epitaxial structure form may be quickly shown. For both configurations, the base length $W_b$ should be much shorter than that needed in avalanching transistor devices. Short base lengths are required to realize the current gain factor $\beta \geq 1$. In contrast, $\beta$ may be much less than 1 in the avalanching transistor devices since the avalanching effect in the impact ionization promotion regions will multiply what few carriers actually reach the area up to essentially unity transfer proportions.

The regional means in the base for limiting the predominant area of injection to only a portion of the emitter base junction are like those described above and are also essential for optimization of the non-avalanching devices. FIG. 9A illustrates a basic lateral non-avalanching magnetic transistor device. The configuration is very similar to that shown in FIG. 7A and 7B except that the base length $W_b$ is approximately 3 micrometers or less and a base contact region 10 has been added.

Figure 9B:
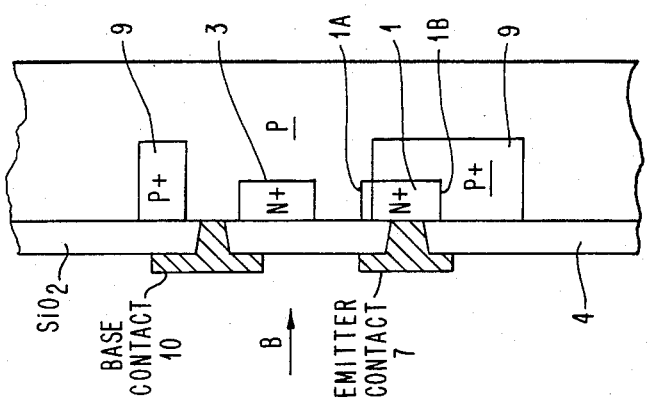
FIG. 9B illustrates a horizontal cross-section taken through the emitter and collector regions of the device shown in FIG. 9A.
Figure 9A:
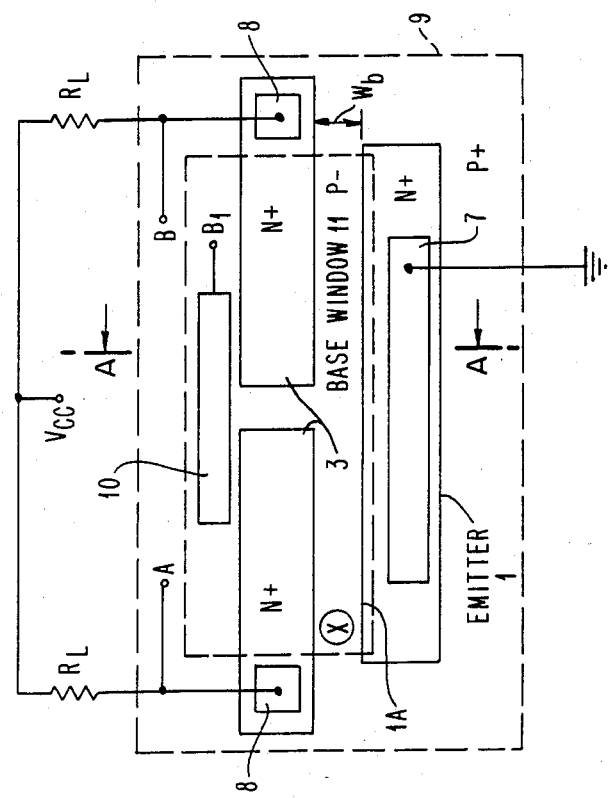
FIG. 9A illustrates a semi-schematic plan view of an alternative preferred embodiment of a magnetically sensitive transistor of the present invention which does not operate in the avalanche mode.

As can be seen from the cross-sectional view of the device 9A shown in FIG. 9B, the P+ suppression pocket completely surrounds both the emitter and the collectors except for the region identified in FIG. 9A as region 11 where an effective base "window" of lower P type concentration than the P+ pocket exists.

No ionization promotion regions or means are required at the collector-base junctions since the device is operated below the avalanche collector potential. In the configuration shown, the emitter 1 is rectangular in form, for example, and is diffused into the injection control P+ pocket region 9. The device configuration is sensitive to magnetic fields applied normal to the surface of the base, i.e., in a vertical direction as shown in FIG. 9B. The collector current $I_o$ is proportional to the base current $I_\beta$ applied to the base terminal through base contact 10. A differential collector current is induced by the Lorentz modulation of minority carrier injection along the maximum dimension of the localized emitter-base junction area facing the collectors in the manner described above. The magnitude of the differential current is given by the following expression.

$$\Delta I = 2\beta I_b \frac{A_e^*}{A_e} \text{Sinh}\left(\frac{qV_L}{KT}\right) \quad (34)$$

Where:
 $\beta I_b$ is collector current
 $\beta$ is current gain $I_c/I_b$

The efficiency of the current transduction mechanism is similar to that derived for the avalanching transistor device for equal quiescent current conditions. That is, for $\beta I_b = I_o$. Identical local levels of emitter injection or suppression are also assumed. The magnetic transduction efficiency is maximized when the emitter current is dominated by the emissions from a region of the surface area such as the portion of the emitter-base junction surface facing toward the collectors or collector.

The velocity vector at the injecting emitter surface which is used to develop the Lorentz potential will determine the most sensitive magnetic axis.

For example, if injection were controlled to occur preferentially at the bottom surface of the emitter 1, the device would be most sensitive to magnetic components directed in the X axis rather than the Z axis. Such devices are illustrated by FIGS. 14A, 14B and 15A and 15B. Devices using the Lorentz potential developed by bottom surface injection to modulate injection at other areas are shown in FIGS. 16 through 19.

An expression for the differential voltage developed at the collector terminals is obtained by multiplying expression (34) by the load resistance $R_L$ and yields the following:

$$\Delta V = 2R_L \beta I_b \frac{A_e^*}{A_e} \text{Sinh}\left(\frac{qV_L}{KT}\right) \quad (35)$$

The differential magnetic transduction voltage of this lateral non-avalanching transistor device is similar to that of the avalanche device if the load resistors $R_L$ are set equal in value to the avalanche resistance $R_A$ described above. The upper cut off frequency of these devices is predicted to be in the range of 100 megahertz or or more for the avalanching transistor device and somewhat less for the non-avalanching device based on distributed capacitive effects and not on transit time considerations. To improve the frequency response of non-avalanching type devices, low resistance values such as 600 ohms should be used for the load resistors $R_L$.

As alluded to earlier, vertical or epitaxial structures of these devices are also operable and have been constructed as shown in the following figures.

FIGS. 10A and 10B, 11A and 11B illustrate plan view and cross-sectional schematics for vertically integrated non-avalanching magnetic sensor devices according to the present invention. The dominant injecting emitter surface faces the collectors and is positioned either below or above the rectangularly shaped collectors by an epitaxially grown P− type base thickness of approximately 2 micrometers.

The device is sensitive to magnetic fields applied parallel to the substrate surface and normal to the maximum dimension of the rectangular emitter diffusion that is perpendicular to the carrier injection vector. The carrier velocity vector is in the FIG. 10A and 10B directed parallel with the Z axis and the differential current and voltage response signals are derived from the magnetic transduction mechanism given by expressions (34) and (35) respectively.

Figure 10A:
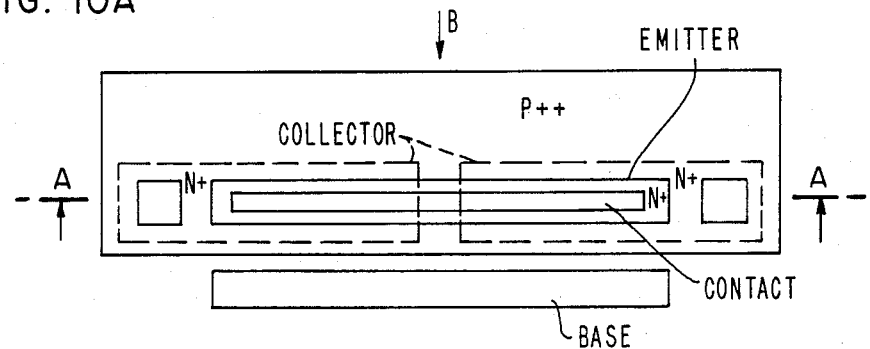
FIG. 10A illustrates a plan view of a vertically integrated (epitaxial) form of a preferred embodiment of the present invention.
Figure 10B:
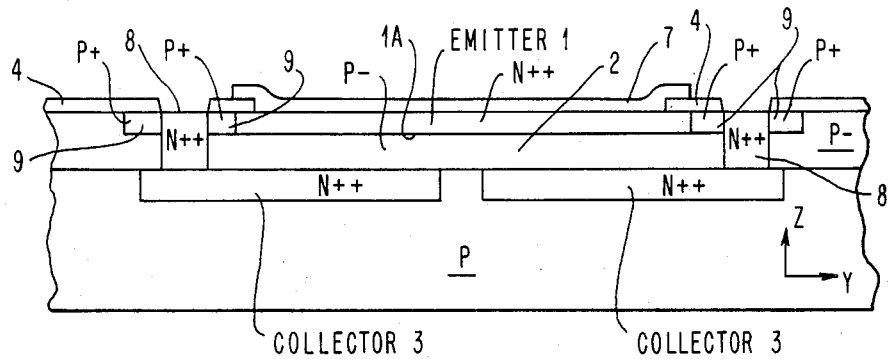
FIG. 10B illustrates a horizontal cross-section taken through the device as illustrated in FIG. 10A.

A P+pocket region 9 surrounds the sides of the emitter 1 to limit injection as shown in FIG. 10B to the bottom surface of the emitter 1 surface 1A.

Figure 11A:
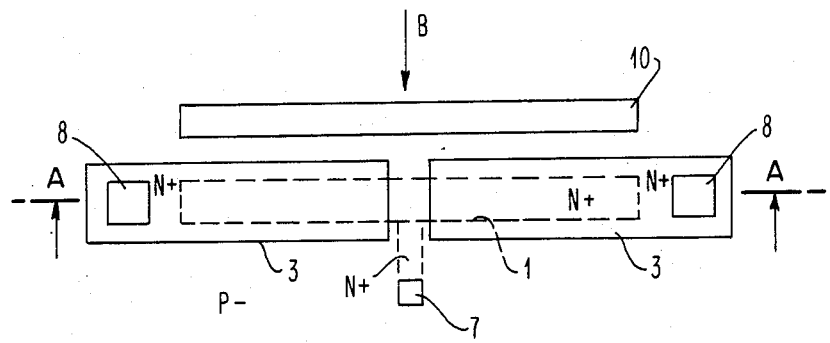
FIG. 11A illustrates a plan view of another form of a preferred embodiment of a vertically integrated (epitaxial) transistor according to the present invention.
Figure 11B:
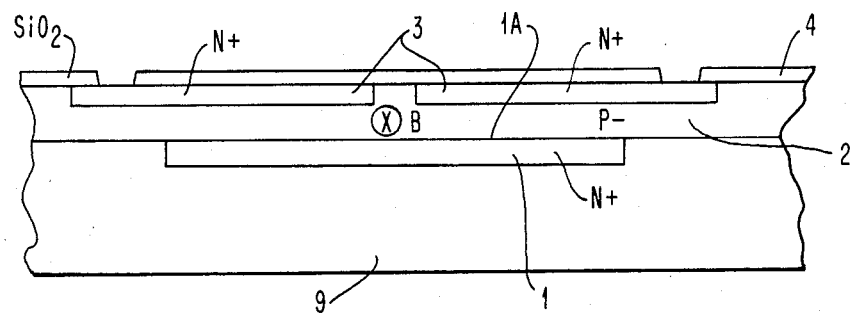
FIG. 11B illustrates a horizontal cross-section of the device as shown in FIG. 11A.

FIGS. 11A and 11B illustrate the inverse type of structure in which the collectors 3 overlie the emitter region 1. In this configuration, the base or substrate itself can be of P+material to surround the emitter on all surfaces except for the top surface 1A at an epitaxial layer of P−material providing an injection enhancing window area facing the collectors 3 as shown in FIG. 11B.

For the devices shown in FIGS. 10-11, high magnetic sensitivity is achieved by constraining the emitter injection to lie in the Z axis normal to the X-Y plane. For example, injection is suppressed around the perimeter of the emitter in FIG. 10B by the use of the P+pocket that surrounds the emitter diffusion 1 and which has a depth identical to that of the emitter diffusion.

In FIG. 11B injection at the rear surface and edges of the emitter diffusion 1 is suppressed by the heavy dopant level of the P+substrate into which the emitter itself is diffused.

By these means, the emitter injection and the resulting Lorentz potential modulation of that injection will be essentially confined to the surface of the emitter total PN junction area which faces toward the collectors. Both of the vertically integrated structures exhibit a current gain factor $\beta$ of 10 or more and exhibit high magnetic field sensitivity.

Figure 12B:
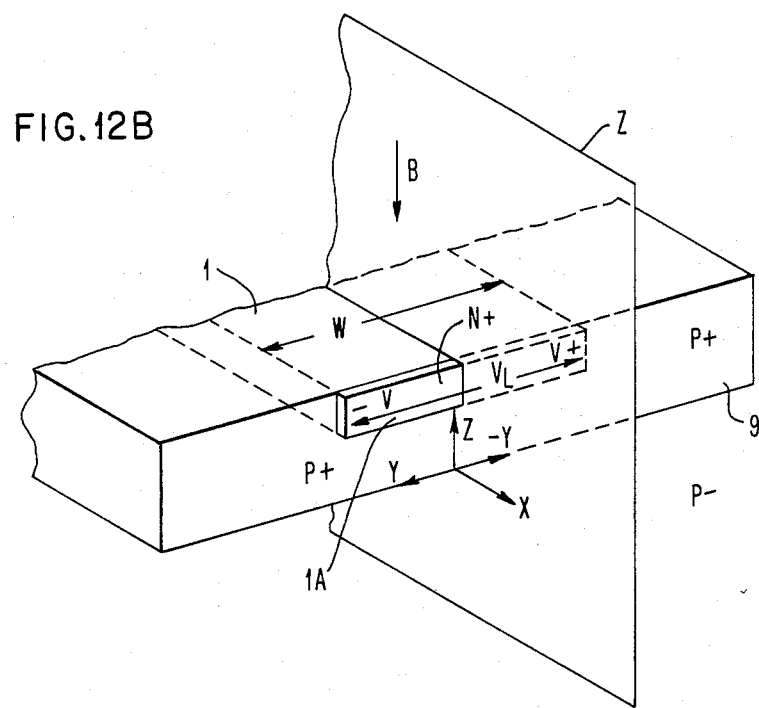
FIG. 12B illustrates a pictorial section in isometric form of the device embodied as shown in FIG. 12A for purposes of teaching.
Figure 12A:
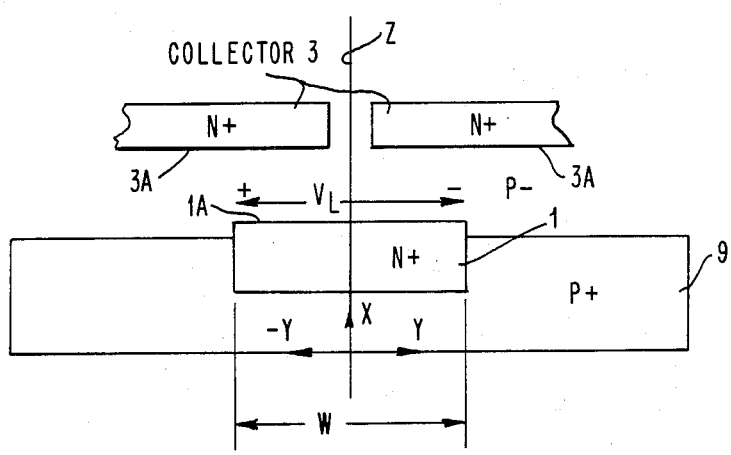
FIG. 12A illustrates a plan view in schematic form of a generic version of the invention for the purposes of instruction.

FIGS. 12A and 12B are generic and are meant to provide a basis for distinguishing these structures from other known magnetically sensitive devices. As will be seen in these figures and discussion which follows, the physical orientation and placement of the collector or collectors relative to the emitter and the sensitive axis for magnetic fields are different in all of these present devices from those known in the past.

FIG. 12A illustrates a partial plan view of a typical device constructed according to the present invention. The P+pocket 9 surrounds the emitter 1 on all sides except for surface 1A which is oriented facing toward the collector face or faces 3A of collector(s) 3. The maximum dimension of the injecting surface 1A is of the dimension W and the corresponding maximum Lorentz potential $V_L$ is developed across that width as shown in FIG. 12A. An imaginary plane Z is shown perpendicularly bisecting the maximum width of the emitter area or of the dominant emitter area. It also bisects the Lorentz potential contour since, by definition, the contour potential will be 0 at the midpoint of the width across which the Lorentz potential is developed. The plane Z also separates the two collectors 3 as shown in FIG. 12A. In these figures, the Lorentz developing area and the primary injection area are identical; as will appear later, this is not necessary.

As shown in FIG. 12B, a sectional view taken along the section line AA indicated in FIG. 12A, the face of emitter 1 defined as face 1A and is emitting carriers primarily in the X axis direction and has a maximum dimension W. It is across this maximum dimension that the Lorentz potential contour is developed. This device will be most sensitive to magnetic vector components in the Z axis directed perpendicular to the XY plane. Relative to the emissive surface or to the dominant area of injection 1A, it will be seen that both collectors 3 lie on the same side of that surface, and with each collector 3 on one side and the two collectors on opposite sides of the Z plane. In the preferred embodiment, the two collectors 3 are equidistant from a predominant emissive surface 1A. This is shown by the parallism in FIG. 12A and in the circular or concentric configurations of FIGS. 13A and 13B.

Figure 13A:
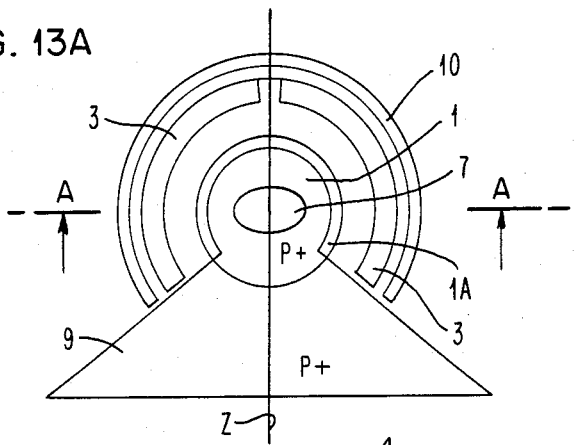
FIG. 13A illustrates a plan view of an alternative preferred form of the invention constructed with a relatively circular emitter and arcuate collectors.
Figure 13B:
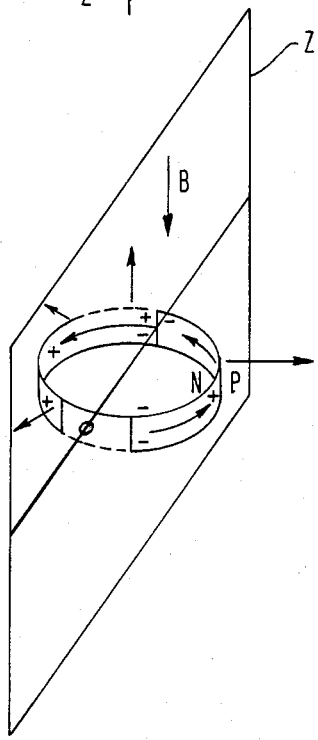
FIG. 13B is a semi-pictorial view in isometric form of a portion of the device shown in FIG. 13A.
Figure 13C:
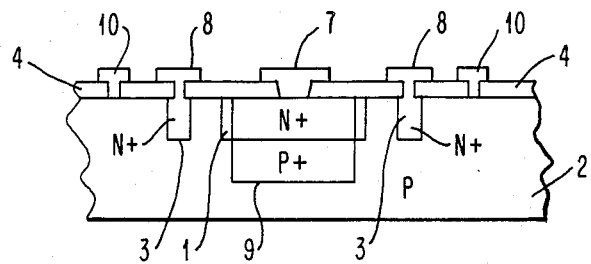
FIG. 13C is a cross-sectional view taken through the plane shown in FIG. 13A for teaching purposes.
Figure 45B:
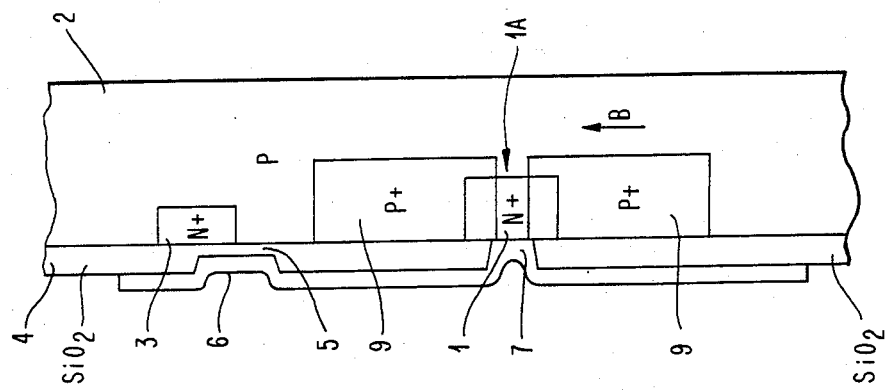

In FIG. 13A, a circular diffused emitter 1, slightly greater in diameter but of less depth than a deeper diffused circular P+pocket 9, confines the dominant area of injection to the periphery of the circular injector surface 1A. The cross section in 13C illustrates this point. The arcuately shaped collectors are equidistant in the perpendicular direction at all points from the corresponding facing emissive surface 1A, lie on opposite sides of the imaginary Z plane, and the plane passes through the emissive surface perpendicular to it and bisecting the Lorentz potential contour (passing through its null) on it along its maximum length, in this case measured as its circumference. An outer concentric arcuate base contact is also shown and functions as described previously for rectangular configurations.

Turning to FIGS. 14A and 14B, a vertically injecting, lateral, bipolar, non-avalanching, magnetically sensitive transistor structure is also illustrated. In this structure, the device is best understood from its cross sectional view in FIG. 14B taken along the section line AA shown in FIG. 14A. The elements are essentially the same as those previously described, except that it will be seen that the P+limiting pocket 9 effectively shields the front, rear and end surfaces of the emitter 1 to greatly reduce injection there, leaving only the bottom surface 1A for dominant injection. Such a device will be sensitive to the magnetic field vectors as shown in FIG. 14B. These pass parallel to the imaginary Z plane which perpendicularly intersects the surface 1A. They are parallel with the primarily dominant injecting surface 1A as previously described.

Figure 15A:
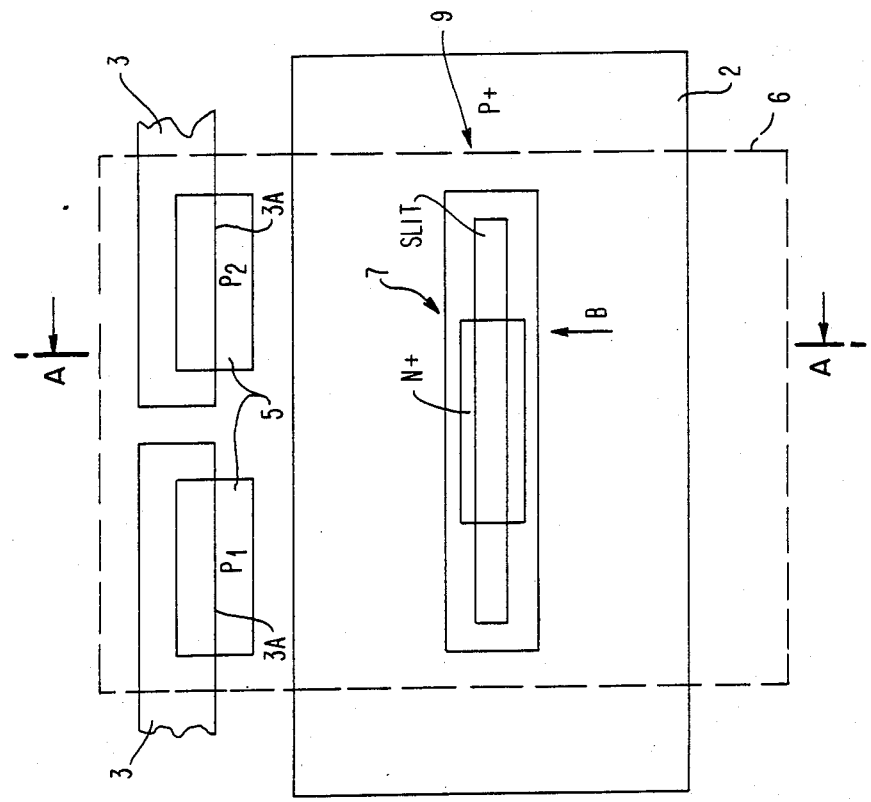
FIG. 15A illustrates a plan view of a vertically injecting emitter configuration of a preferred, avalanching form of the magnetically sensitive transistors of the present invention.

An avalanching version of the device shown in FIGS. 14A and 14B is illustrated in FIGS. 15A and 15B. The impact ionization promotion regions P1 and P2 (#5) are illustrated in the top or plan view of FIG. 15A and are seen to be of the thin oxide field enhancement type in FIG. 15B. It is, of course, well understood that increased P+dopants in the vicinity of the collector base diffusion may also be used to enhance impact ionization.

Some specific examples of the preferred embodiments, their parameters and manufacturing steps will now be given. Referring to FIGS. 9A and 9B, a lateral bipolar magnetic transistor is constructed in the following manner. The first step is to grow an initial oxide layer about 6500 Å thick on the surface of a 5 Ωcm P type substrate. The next step is to implant the entire substrate with boron ions everywhere except in the P−base window labeled 12 in FIG. 9A. To accomplish this step, a mask is used to remove the initial oxide layer from the surface of the silicon substrate except in the region where it is not desired to implant boron, like region 12 of FIG. 9A. Boron is then implanted with an energy of approximately 100 KEV and a dose of approximately $6.8 \times 10^{13}$ ions/cm². Drive in is then accomplished at approximately 1150° C., for a time interval long enough to attain a P+layer of approximately 0.2 Ω-cm and a depth of approximatley 4 microns. The next step in the process is to diffuse both collector and emitter regions. The emitter region is approximately $1.8 \times 10^{-3}$ cm long and $3.8 \times 10^{-4}$ cm high. The collector regions are similar in length and approximately $4.5 \times 10^{-4}$ cm high. Both emitter and collector diffusions are approximately 2 microns deep and exhibit a sheet resistivity of about 10 ohms per square. The collectors are spaced apart from one another by a distance of approximately $2.54 \times 10^{-4}$ cm. The base width $W_b$ of typical devices are in the range of $1 \times 10^{-4}$ cm to $4 \times 10^{-4}$ cm. Finally, contacts are made to the collector and emitter diffusions and to the substrate in back of the collectors to form the base contact.

The avalanche structure of FIG. 8A and 8B is fabricated in a similar manner. Since this magnetic transistor is operated in the avalanche mode, there are two major structural differences. The first difference is the base length $W_b$ typically $2.7 \times 10^{-3}$ cm long. The second difference is the use of ionization promoter regions $P_1$ and $P_2$. These regions are formed by growing a thin oxide layer 1000 Å thick to form an insulator between the collector diffusions and the shield. This thin oxide layer is only under the promoter regions $P_1$ and $P_2$. The oxide thickness elsewhere is typically 7000 Å.

The structure of FIG. 7A is quite similar to the avalanche structure of FIG. 8A. The major difference is the location of the injection suppression region 9 in this figure. This heavily doped P+region is implanted in a manner similar to that described in connection with FIGS. 9A and 9B. Base width $W_b$, ionization promoter and diffusions are the same as those used to fabricate the structure of FIG. 8.

FIGS. 11A and 11B illustrate an epitaxial bipolar magnetic sensor. This device is constructed in the following manner. An N+type emitter is formed by diffusing arsenic into a 0.1 Ωcm P type substrate. The emitter is rectangular with the following dimensions. Lenght=$2.0 \times 10^{-3}$ cm. Height=$2.5 \times 10^{-4}$ cm and depth is approximately 2 micrometers. The emitter exhibits a sheet resistivity of approximately 10 Ω per square. A 4 micron thick P type layer in the range of 0.5 to 2 Ωcm is then epitaxially grown on the surface of the P type substrate containing the emitter diffusion 0. After growing the P−epilayer, an emitter contact, phosphorous, diffusion is accomplished and driven into a depth of approximately 4 microns. This diffusion must make contact with the arsenic emitter region lying below the epilayer. Collector regions are then diffused into the P−epilayer and thermally driven into a depth of about 2 micrometers. The base region which separates the collectors from the emitter results in a depth of approximately 2 micrometers. Contacts are then made to the collector, emitter and base regions.

Referring to FIGS. 14A and 14B, this structure is a vertical injecting lateral bipolar magnetic transistor. A P+pocket region 9, is implanted into a 5 Ωcm substrate except in a narrow slit within the emitter region 1, FIG. 14A, where vertical injection is to occur. This slit has the following dimensions. Length=$2 \times 10^{-3}$ cm, height=$2 \times 10^{-4}$ cm and a depth of approximately 3 micrometers. The base width $W_b$ separating the 2 micrometer deep emitter and 1 micron deep collector diffusion is typically in the range of $1 \times 10^{-4}$ cm to $5 \times 10^{-4}$ cm. The collector and emitter diffusions have a typical sheet resistivity of 10 ohms per square. The oxide thickness is grown to about 7000 Å and the space between collector diffusions is typically $2 \times 10^{-4}$ cm. Contacts to the emitter, collectors and base are made in the usual manner well known in the art.

Having described several types of new magnetic transistors with regard to preferred embodiments thereof and having given a complete description of the theory of operation and mode of construction, some variations of these devices may be expected. A generalized description of devices which employ the broad concept of Lorentz potential generation in one area for use in that or in another dominantly injecting area will soon be given. Some general observations follow.

For example, some of the devices illustrated are basically avalanche transistor devices operating above avalanche breakdown conditions. Some devices, on the contrary, are lateral bipolar transistors or vertical bipolar transistors which operate below avalanche breakdown of the base-collector junction. The transduction mechanism is identical for all of the devices and has been described as being a Lorentz field modulation of emitter injection. The Lorentz modulating potential reaches the theoretical limit for solid state devices and is transformed exponentially into a differential current by transistors of this class. The specific choice of a device or its geometry is governed by the requirements of a specific application. The magnetic sensitivity of various devices can be fixed to a desired level less than about 5 millivolts per gauss (50 volts per tesla). Signal to noise ratios of between 5 and 10 per gauss given a bandwidth of 1 megahertz appear at this time to be reasonably attainable for both types of devices. To realize this signal to noise ratio, bipolar devices require a $\beta$ gain of approximately 10 or more. The avalanching device, due to its low collector impedance, has a higher frequency capability and is sensitive into the range of 100 megahertz or more. Both types of devices, however, have very small sensitive areas and may exhibit high resolution capabilities.

As will be seen from the foregoing discussion, by placing both collectors on the same relative "side" of the emissive surface, i.e., both facing the same emitting surface instead of placing the collectors, as in some prior art devices, on opposite sides of the emitter surface, the device is able to utilize the unique Lorentz potential modulation of emitter injection effectively. If separate emitter surfaces are used, as they can be, for each collector, the collectors will each face their own emissive surface. In the prior art devices, the collectors were not positioned to utilize the Lorentz potential contour developed along the maximum dimension of the predominant injection area. In addition, special limiting means in this invention have been incorporated to limit or control the predominant area of injection to a portion of the emitter-base PN junction which is less than the total thereof.

The foregoing devices were provided with means to achieve a dominant emitter injection surface along which a maximum Lorentz potential can be developed. This potential is created by a magnetic field applied parallel to that injecting surface and nominally oriented perpendicular to its length. The Lorentz potential developed along the length of the injecting region was also described as modulating the level of minority carrier injection occurring along the length of that region. When two collectors are positioned parallel to and equidistant from that injecting surface on opposite sides of an imaginary plane drawn perpendicular to and bisecting that injecting surface and passing through the Lorentz potential null point, a maximum differential collector current is produced by application of the magnetic field.

Figure 18A:
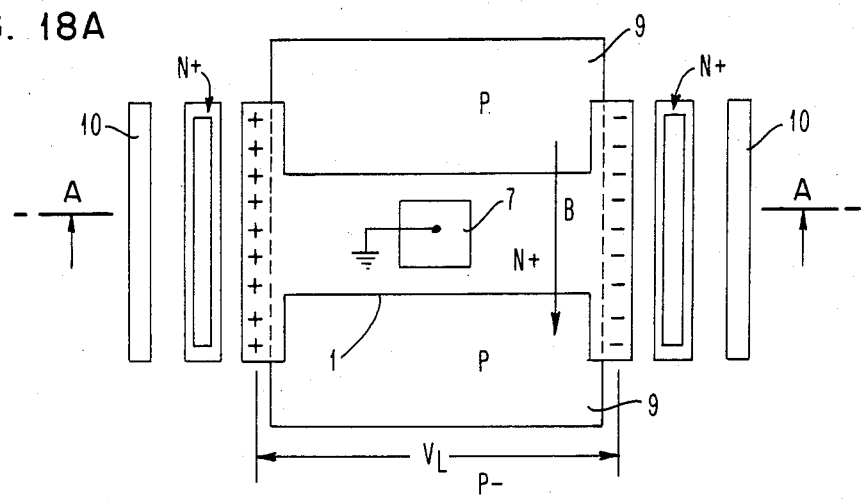
FIG. 18A illustrates a dual collector configuration of a magnetic transistor when a separate injecting Lorentz potential region coupled to primary injecting regions facing the collectors is developed by employing an injection suppression technique.
Figure 18B:
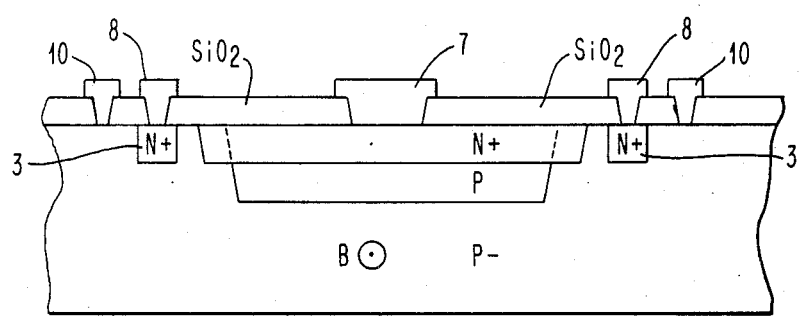
FIG. 18B illustrates a longitudinal cross-section taken along line A—A' drawn through the central region of the device shown in FIG. 18A.
Figure 16:
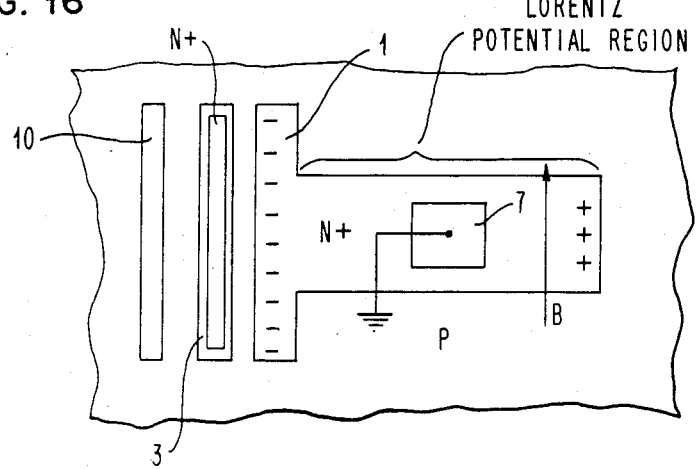
FIG. 16 illustrates a single collector configuration of a preferred embodiment of the invention showing a structure having a separate injecting Lorentz potential region coupled to a primary injecting region facing the collector.
Figure 17A:
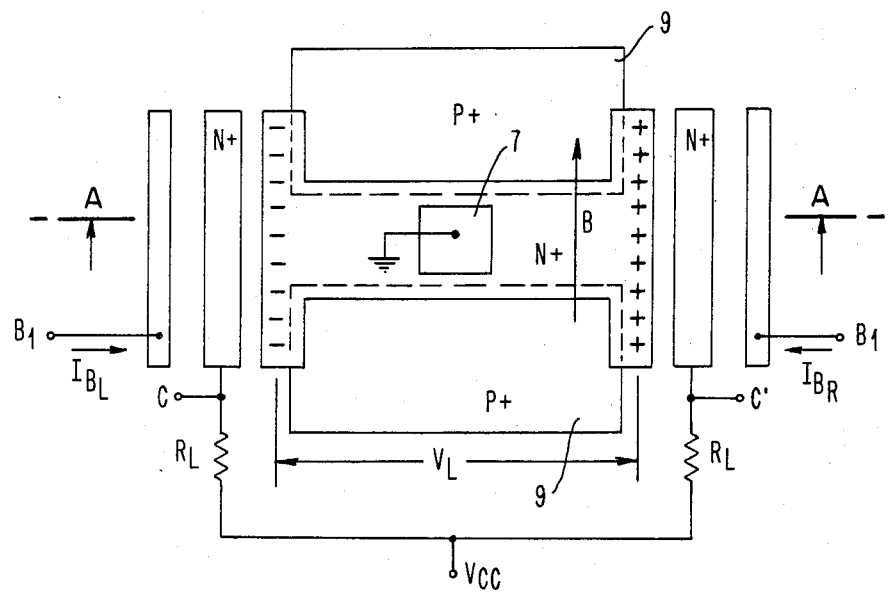
FIG. 17A illustrates a dual collector configuration of a preferred embodiment of the invention in which a separate injecting Lorentz potential region employing an injection suppression technique is coupled to primary injecting regions facing the collectors.
Figure 17B:
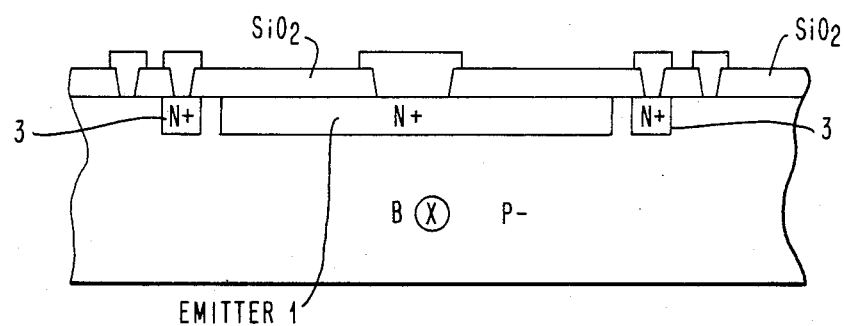
FIG. 17B illustrates a longitudinal cross-section taken along the line A—A' indicated in FIG. 17A.

FIGS. 16 through 18 illustrate a different magnetic sensor configuration. The basic concept of Lorentz modulation of emitter injection is optimized in these structures. In these devices, a Lorentz potential is developed along a first injecting region which is separate from the primary modulated injection region. The Lorentz potential thus developed is applied to a primary modulated injection region to modulate injection there.

The first injecting region is called the Lorentz developing region as opposed to the primary or modulated injecting region. The Lorentz developing region is contiguous with or electrically connected to the primary modulated injecting region and serves to modulate the intensity of minority carrier injection occurring there.

The devices of FIGS. 16 through 18 are sensitive to magnetic fields directed parallel to the substrate surface. They are insensitive to field components directed otherwise. Referring to FIG. 16, the emitter diffusion is formed in such a manner that it resembles the left half of the letter H. This shape is the result of terminating the horizontal H member of the emitter diffusion, (the Lorentz potential developing region) at one end with a vertical H member, thus forming the left half of the letter H. The vertical H member of the emitter acts as the primary injection region. A collector diffusion is positioned opposite to and parallel with the vertical primary emitter injection region. Contact is made to the base or substrate in such a manner that the collector is positioned between the base contact and the primary injecting surface. It is thus positioned parallel with both collector and emitter and closer to the collector than to the emitter. Positioning the base contact in this manner enhances minority carrier injection from the surface of the primary injection region which faces the collector. This base contact arrangement also stimulates injection to occur underneath the Lorentz developing region of the emitter diffusion. This vertical injection component is necessary to provide the device with its magnetic behavior. The magnetically sensitive axis is parallel to the injecting surface of the Lorentz region. The response is a maximum when the field is directed perpendicular to its length (the horizontal portion of the emitter diffusion). A magnetic field thus applied reacts with the minority carriers injected therefrom and creates a Lorentz potential along the bottom surface of the Lorentz developing region within the depletion zone developed at the emitter P-N junction. The total value of the Lorentz potential developed between the center of the Lorentz developing region and its end is supplied to the primary injection region by the emitter. The intensity of this Lorentz potential is proportional to the length of the Lorentz developing region and is responsible for modulating injection occurring at the face of the primary modulated injection region which faces the collector. It is important to note the the full magnitude of Lorentz potential thus developed is applied to the entire primary injection area instead of the graduated potential applied when the Lorentz developing area and primary injection area are the same area.

FIGS. 17 and 18 illustrate dual collector configurations. These structures are similar to the single collector structure of FIG. 16. A second collector and primary injection region are positioned opposite the first primary injection region at the other end of the Lorentz developing region.

Referring to FIG. 17, the orientation of the magnetic field is shown increasing emitter injection in the region facing the right collector and simultaneously reducing injection of monority carriers from the dominant injecting surface facing the left collector. The opposite situation is illustrated by FIG. 18 since the polarity of the magnetic field as shown develops a Lorentz potential in the opposite direction.

It has already been discussed above that the magnitude of the Lorentz potential depends on carrier velocity and not the number of carriers. The object of the structures of FIG. 17 and FIG. 18 is to minimize the total current injected from the horizontal (Lorentz developing) region of the emitter where the Lorentz modulating potential is created, and to maximize minority carrier injection at the ends of the emitter where injection modulation is desired. Suppressing injection from the Lorentz region of the H structure is illustrated in FIGS. 17 and 18.

Referring to FIG. 17, injection suppression is accomplished around the inner perimeter of the emitter-base junction region by increasing the doping level of the base region in this vicinity. This local injection suppression technique is somewhat different from the technique shown in FIG. 18. For the device in FIG. 18, the injection level is also reduced along the bottom of the Lorentz developing region of the emitter in addition to suppressing injection along the inner perimeter of the base-emitter junction. In both structures, the maximum Lorentz potential is electrically coupled to the primary injecting surfaces close to the collectors.

The structures of FIGS. 16–18 are very sensitive magnetic field detecting devices and exhibit low intrinsic noise levels. Sensitivities greater than 1 mv/Gauss (10 volts per tesla) can readily be achieved from such devices with signal to noise ratios greater than 10 per Gauss ($10^5$ per tesla).

All of these structures exhibit a Lorentz developing area which can be intersected by an imaginary plane perpendicular to the injection surface and passing through the Lorentz null point. The collector or collectors are located with respect to the Lorentz developing region and the imaginary plane referenced to in such a manner that each collector is on one side of the plane. The collectors must have at least half of their total collection area on one side of the plane in order to detect any current changes. In the H-shaped or single collector structures, the entire collector is, in each instance, entirely on one side or the other of this plane. The same condition is true for all the other embodiments shown. It can be easily understood that unless more than half of a collector lies on one side or the other, there can be no dominant effect of injection modulation picked up at that collector since its other portion will receive input from the emitter which is equal. Therefor, given that the plane referred to can be constructed in all cases to define the proper placement of the collector or collectors and that this arrangement has not been heretofore shown in the prior art, it is easy to distinguish devices constructed in accordance with the techniques herein from ordinary transistors and prior magnetic transistors alike.

Turning to FIG. 19, the primary function of FIGS. 19A–19C is to illustrate a means of electrically connecting single and dual collector magnetic transistors to a source of bias potential for use. It is also desired to illustrate their equivalent circuits in FIG. 19B and to show a means for balancing the D. C. potential measured between output terminals C and $C_1$. Turning to FIG. 19A, the single collector structure illustrated is similar to the structure shown in FIG. 16 and works in the same manner; its biasing and balancing are obvious in FIG. 19B. The dual collector structure of FIG. 19A is similar to that shown in FIG. 17. The dual collector structure shown in FIG. 19C is similar to the structure shown in FIG. 9A. The single collector structure of FIG. 19C is also similar to FIG. 9A if one of the collector diffusions is removed in that Figure. These referenced structures have already been discussed in detail. All structures illustrated in FIG. 19 omit for simplicity the regional base dopant means used in the referenced structures to suppress injection at certain surfaces of the emitter-base junction.

Having thus described my invention with reference to several preferred embodiments thereof and having taught the basic theory and operative phenomenon associated with employing structures built according to the principles of the invention, many variations and modifications will be evident to those of skill in the art. Hence, it is desired that what is described by the following claims be taken by way of illustration, not limitation.

What is claimed is:

1. A magnetically sensitive transistor having an emitter, a base and two collectors, characterized in that:

said base forms PN junctions with said emitter and said collectors for injecting minority carriers from said emitter and collecting sdid minority carriers at said collectors when said junctions are properly biased;

said emitter has at least one injection area for the injection of minority carriers having a dimension of its surface identified as the longest dimension thereof;

said collectors are positioned relative to said emitter such that each collector lies on one side of an imaginary plane constructed perpendicular to the surface of said emitter surface having said longest dimension and bisecting said longest dimension and further including;

control means for defining at least one predominant area of injection at said emitter surface having said longest dimension by inhibiting injection at other areas of said emitter base junction;

said control means comprising a region of the same conductivity type as said base region, but more heavily doped than said base region, said more heavily doped region surrounding said emitter laterally on all sides so that injection from said emitter takes places predominantly in a vertical direction defined as perpendicular to a plane defined by said emitter and said collectors.

* * * * *